(12) United States Patent
Yu et al.

(10) Patent No.: US 12,100,692 B2
(45) Date of Patent: Sep. 24, 2024

(54) DISPLAY PANEL, PREPARATION METHOD THEREOF AND DISPLAY DEVICE

(71) Applicant: Shanghai Tianma Micro-Electronics Co., Ltd., Shanghai (CN)

(72) Inventors: Quanpeng Yu, Shanghai (CN); Yang Zeng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 338 days.

(21) Appl. No.: 17/479,226

(22) Filed: Sep. 20, 2021

(65) Prior Publication Data
US 2022/0005791 A1   Jan. 6, 2022

(30) Foreign Application Priority Data

Jun. 30, 2021   (CN) .......................... 202110736749.2

(51) Int. Cl.
*H01L 25/075*   (2006.01)
*H01L 33/58*   (2010.01)
*H01L 33/60*   (2010.01)
*H01L 33/62*   (2010.01)

(52) U.S. Cl.
CPC .......... *H01L 25/0753* (2013.01); *H01L 33/58* (2013.01); *H01L 33/60* (2013.01); *H01L 33/62* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

2015/0362165 A1\* 12/2015 Chu ........................ H01L 33/32
                                                           362/235
2017/0133357 A1\* 5/2017 Kuo ...................... H01L 25/167

FOREIGN PATENT DOCUMENTS

CN            111863854 A      10/2020

\* cited by examiner

*Primary Examiner* — Feifei Yeung Lopez
(74) *Attorney, Agent, or Firm* — ALSTON & BIRD LLP

(57) ABSTRACT

Provided are a display panel and a preparation method of the display panel. The display panel includes a first substrate and a second substrate which are disposed opposite to each other, a plurality of light-emitting elements arranged between the first substrate and the second substrate and a plurality of auxiliary structures arranged between the first substrate and the second substrate; where the plurality of auxiliary structures surround the plurality of light-emitting elements and each auxiliary structure is provided with a notch structure on a side of the each auxiliary structure close to a respective one of the plurality of light-emitting elements and on a side of the each auxiliary structure close to a light-emitting surface of the display panel.

18 Claims, 12 Drawing Sheets

DISPLAY PANEL, PREPARATION METHOD THEREOF AND DISPLAY DEVICE

CROSS-REFERENCE TO RELATED APPLICATION

This application claims priority to Chinese Patent Application No. 202110736749.2 filed Jun. 30, 2021, the disclosure of which is incorporated herein by reference in its entirety.

TECHNICAL FIELD

The present disclosure relates to the field of display technology and, in particular, to a display panel, a preparation method thereof and a display device.

BACKGROUND

With the development of science and technology, more and more electronic devices with a display function are widely applied to and bring great convenience for people's daily life and work. Such devices have now become indispensable and important tools for people.

A display panel is an important component of an electronic device for implementing the display function. A light-emitting element in an display panel in the related art has the problem of low luminescence efficiency, which affects a display effect.

SUMMARY

Embodiments of the present disclosure provide a display panel and a preparation method of the display panel, improving luminescence efficiency of the display panel.

In a first aspect, an embodiment of the present disclosure provides a display panel. The display panel includes a first substrate and a second substrate which are disposed opposite to each other, a plurality of light-emitting elements arranged between the first substrate and the second substrate, and a plurality of auxiliary structures arranged between the first substrate and the second substrate.

The plurality of auxiliary structures surround the plurality of light-emitting elements, and each auxiliary structure of the plurality of auxiliary structures is provided with a notch structure on a side of the each auxiliary structure close to a respective one of the plurality of light-emitting elements and on a side of the each auxiliary structure close to a light-emitting surface of the display panel.

In a second aspect, an embodiment of the present disclosure provides a display device. The display device includes the preceding display panel.

In a third aspect, an embodiment of the present disclosure provides a preparation method of a display panel, which is used for preparing the preceding display panel. The preparation method of the display panel includes the steps described below.

The first substrate and the second substrate are provided.

The second substrate is aligned with and attached to the first substrate, where a plurality of light-emitting elements and a plurality of auxiliary structures are arranged between the first substrate and the second substrate, where the plurality of auxiliary structures surround the plurality of light-emitting elements and each auxiliary structure is provided with a notch structure on a side of the each auxiliary structure close to a respective one of the plurality of light-emitting elements and on a side of the each auxiliary structure close to a light-emitting surface of the display panel.

According to the display panel and the preparation method thereof provided in the embodiments of the present disclosure, side light leakage can be reduced through the auxiliary structures surrounding the light-emitting elements, so that optical crosstalk between adjacent light-emitting elements is reduced and a display effect is improved. Moreover, the notch structure is provided on the side of the auxiliary structure close to the light-emitting element and on the side of the auxiliary structure close to the light-emitting surface of the display panel so that light emitted from a side surface of the light-emitting element can be reflected on a surface of the notch structure and the reflected light is emitted from the display panel, improving luminescence efficiency of the light-emitting element and the luminescence efficiency of the display panel.

DETAILED DESCRIPTION

Figure 1:
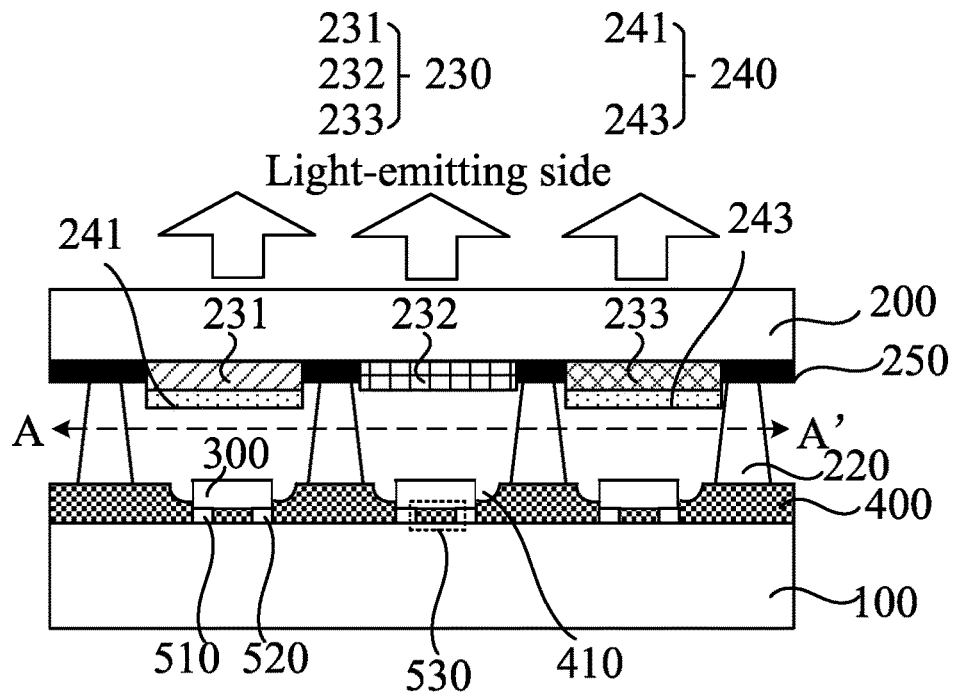
FIG. 1 is a structure diagram of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

It is to be noted that the following embodiments can be combined with each other under the premise of no contradiction.

Figure 2:
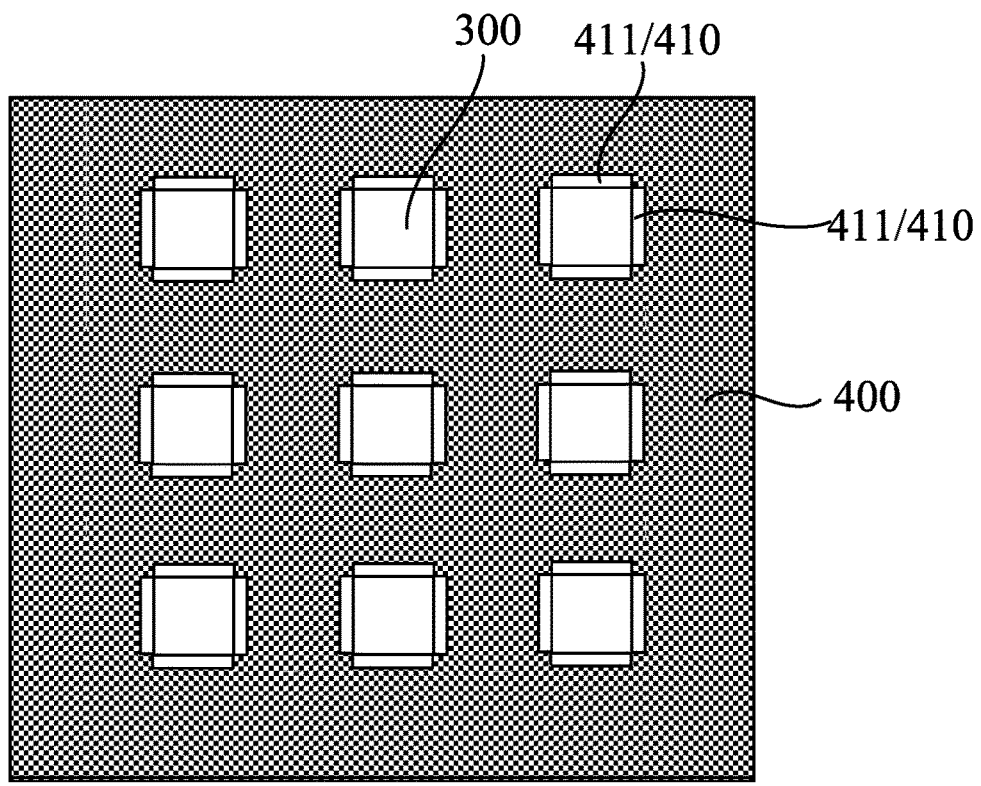
FIG. 2 is a top view of light-emitting elements and an auxiliary structure of the display panel illustrated in FIG. 1.

FIG. 1 is a structure diagram of a display panel according to an embodiment of the present disclosure. FIG. 2 is a top view of a light-emitting layer of a display panel according to an embodiment of the present disclosure. FIG. 2 may be a top view of the display panel taken along A-A' of FIG. 1. Referring to FIG. 1 and FIG. 2, a display panel 10 according to embodiments of the present disclosure includes a first substrate 100 and a second substrate 200 which are disposed opposite to each other, a plurality of light-emitting elements 300 and auxiliary structures 400; where the light-emitting elements 300 are arranged between the first substrate 100 and the second substrate 200; the auxiliary structures 400 surround the light-emitting elements 300; and the auxiliary structure 400 is provided with a notch structure 410 on a side of the auxiliary structure 400 close to the light-emitting element 300 and on a side of the auxiliary structure 400 close to a light-emitting surface of the display panel 10.

The light-emitting element 300 may be, for example, a mini light-emitting diode (mini-LED) or a micro light-emitting diode (micro-LED). A type of the light-emitting element 300 is not limited in embodiments of the present disclosure.

In an embodiment, side light leakage can be reduced by the auxiliary structures 400 surrounding the light-emitting elements 300 so that optical crosstalk between adjacent light-emitting elements 300 is reduced and a display effect is improved. Moreover, the notch structure 410 is provided on the side of the auxiliary structure 400 close to the light-emitting element 300 and on the side of the auxiliary structure 400 close to the light-emitting surface of the display panel so that light emitted from a side surface of the light-emitting element 300 can be reflected on a surface of the notch structure 410 and the reflected light is emitted from the display panel, improving luminescence efficiency of the light-emitting element 300, avoiding the problem that the luminescence efficiency of the light-emitting element 300 is reduced since the light emitted from the side surface of the light-emitting element 300 is absorbed by the auxiliary structure 400, and improving the display effect of the display panel.

It is to be noted that the display panel 10 in the embodiments of the present disclosure may be driven by an active matrix or a passive matrix. When the display panel 10 is driven by the active matrix, the display panel 10 further includes a pixel circuit layer (not shown) between the auxiliary structures 400 and the first substrate 100, where the pixel circuit layer includes a plurality of pixel circuits. The pixel circuits are electrically connected to the light-emitting elements 300 for driving the light-emitting elements 300 to emit light. The pixel circuit layer may sequentially include an active layer, a gate layer, a source/drain electrode layer and an insulating layer between adjacent metal layers, which are arranged on a side of the first substrate 100. Gates, scan lines and first plates of storage capacitors in the pixel circuits may be formed in the gate layer. Sources, drains, data lines and power signal lines in the pixel circuits may be formed in the source/drain electrode layer. The insulating layer may include an oxide of silicon or a nitride of silicon, which is not limited in the embodiments of the present disclosure. The pixel circuit layer may further include an intermediate metal layer. Second plates of the storage capacitors and reference voltage lines may generally be formed in the intermediate metal layer. On the premise that the preceding functions can be implemented, a specific structure of the pixel circuit is not limited in the embodiments of the present disclosure. When the display panel 10 is driven by the passive matrix, a plurality of signal wires for providing signals for the light-emitting elements 300 are provided on the first substrate 100. The signal wires are electrically connected to the light-emitting elements 300. A specific driving manner is not limited in the embodiments of the present disclosure. FIG. 1 illustrates an example in which the display panel 10 is driven by the passive matrix, which is the same in the following embodiments and is not repeated in the following description of the following embodiments.

Optionally, referring to FIG. 1, the display panel further includes a block wall structure (also referred to as a bank) 220 between adjacent light-emitting elements 300. The block wall structure 220 can further prevent the optical crosstalk between the adjacent light-emitting elements 300. A position of the block wall structure 220 is described in the following embodiments and is not repeated here.

It is to be understood that the plurality of light-emitting elements 300 may include a plurality of light-emitting elements of different colors, for example, include a red light-emitting element, a green light-emitting element and a blue light-emitting element. The red light-emitting element, the green light-emitting element and the blue light-emitting element emit red light, green light and blue light respectively, displaying a color picture. The plurality of light-emitting elements 300 may include a plurality of light-emitting elements of the same color, for example, the plurality of light-emitting elements 300 may each or all emit white light. When the light-emitting elements 300 emit white light, optionally, a black matrix 250 and a color resist layer 230 may be further provided on the second substrate 200, where the color resist layer 230 includes a red color resist block 231, a blue color resist block 232 and a green color resist block 233 so that red light is emitted after the white light passes through the red color resist block 231, blue light is emitted after the white light passes through the blue color resist block 232, and green light is emitted after the white light passes through the green color resist block 233. In a case where the light-emitting elements 300 emit blue light, optionally, a color conversion layer may be further provided on the second substrate 200, where the color conversion layer may include, for example, a film with a color conversion function such as a quantum dot layer or a fluorescent material layer. FIG. 1 illustrates an example in which the color conversion layer includes a quantum dot layer 240. When the color conversion layer includes the quantum dot layer 240, the quantum dot layer 240 includes, for example, a red quantum dot 241 and a green quantum dot 243. Red light is emitted after the blue light passes through the red quantum dot 241, and green light is emitted after the blue light passes through the green quantum dot 243, displaying the color picture. When the color conversion layer is provided on the second substrate 200, the black matrix 250 and the color resist layer 230 may also be provided on the second substrate 200, as shown in FIG. 1.

The auxiliary structures 400 may surround all of the light-emitting elements 300 or surround only part of the light-emitting elements 300, which is not limited in the present embodiments and can be set according to practical situations or applications. The auxiliary structures 400 may be in contact with the light-emitting elements 300 or at a certain distance from the light-emitting elements 300, which is not limited in the present embodiment. FIG. 1 and FIG. 2 illustrate an example in which the auxiliary structures 400 surround all the light-emitting elements 300 and the auxiliary structures 400 are in contact with the light-emitting elements 300. Optionally, with continued reference to FIG. 2, the plurality of auxiliary structures 400 may be provided as an entire surface and the plurality of auxiliary structures 400 provided as the entire surface include a plurality of openings which are disposed in a one-to-one correspondence with the plurality of the light-emitting elements 300.

Figure 3:
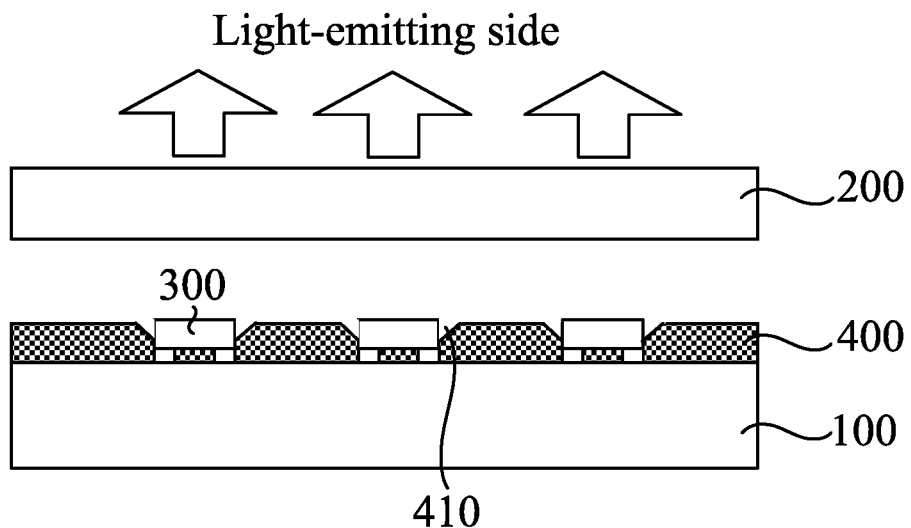
FIG. 3 is a structure diagram of another display panel according to an embodiment of the present disclosure.

For example, an entire auxiliary structure layer may be disposed on one side of the first substrate 100 close to the second substrate 200. The auxiliary structure layer is etched so that the plurality of openings and the notch structures are formed, and then the light-emitting elements 300 are arranged in regions of the openings. For example, after the plurality of light-emitting elements 300 are arranged, an entire adhesive layer may be provided on all the light-emitting elements 300 and then melted. The melted adhesive layer flows around the light-emitting elements 300 and the openings are formed in regions where the light-emitting elements 300 are arranged due to the existence of the light-emitting elements 300, so as to expose the light-emitting elements 300 and ensure the light emission of the light-emitting elements 300. The adhesive layer is cured so that the auxiliary structures 400 surrounding the light-emitting elements 300 are formed and all the auxiliary structures 400 are provided as the entire surface. Then, the notch structure may be etched on the side of the auxiliary structure 400 close to the light-emitting element 300 and on the side of the auxiliary structure 400 close to the light-emitting surface of the display panel through an etching technique. It is to be noted that a technique or method for preparing the auxiliary structures 400 is not limited in the present embodiments and can be selected according to practical situations. In the display panel provided in the embodiments of the present disclosure, the auxiliary structures are provided as the entire surface, prepared through a simple technique, and integrally formed so that the process is simplified and the cost is optimized. FIG. 3 is a structure diagram of another display panel according to an embodiment of the present disclosure. Referring to FIG. 1 and FIG. 3, the notch structure 410 may be, for example, a non-convex notch. "Non-convex" means that the notch structure 410 does not protrude towards a side pointing towards the light-emitting element 300 but recesses towards an interior of the auxiliary structure 400. For example, the notch structure 410 may be an arc-shaped notch shown in FIG. 1 or a slope-shaped notch shown in FIG. 3. A shape of the notch structure 410 is not specifically limited in the embodiments of the present disclosure. It is to be noted that FIG. 1 and FIG. 3 are only sectional views of the display panel. It is to be understood that the notch structures 410 shown in FIG. 1 and FIG. 3 are a concave curved surface or a flat surface in space. The surface connects a side wall of the auxiliary structure 400 (the side wall of the auxiliary structure 400 where an opening corresponding to the light-emitting element 300 is disposed) to a top surface (a surface close to the second substrate 200) of the auxiliary structure 400.

Figure 4:
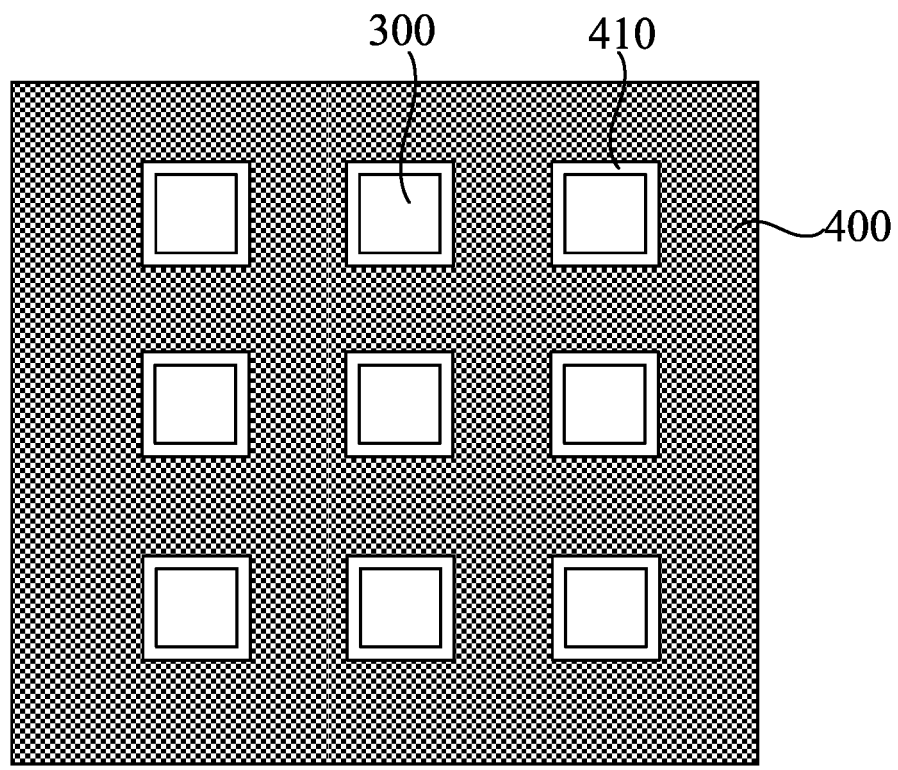
FIG. 4 is a top view of another light-emitting elements and an auxiliary structure of the display panel illustrated in FIG. 1.

FIG. 4 is a top view of light-emitting elements and an auxiliary structure of a display panel according to an embodiment of the present disclosure. Referring to FIG. 2, a periphery of the light-emitting element 300 may be surrounded by interrupted notches on one side of the notch structure 410 close to the light-emitting element 300. Referring to FIG. 4, the notch structure 410 may also be an uninterrupted notch surrounding the periphery of the light-emitting element 300. That is, the notch structure 410 surrounds the light-emitting element 300.

With continued reference to FIG. 2, the notch structure 410 includes a plurality of notch units 411 which are spaced apart from each other and surround the light-emitting element 300. Moreover, a certain interval exists between adjacent notch units 411. For example, the plurality of notch units 411 are spaced apart from each other and are arranged in one loop surrounding the light-emitting element 300. Referring to FIG. 4, the notch structure 410 consists of a continuous notch and a projection of the notch on the first substrate 100 is a closed annular pattern surrounding the light-emitting element 300. Since the light-emitting element 300 emits light in all directions, the notch structure 410 surrounding the light-emitting element 300 can reflect light emitted from the side surface of the light-emitting element 300 in all directions and the reflected light is emitted from the display panel, further improving the luminescence efficiency of the light-emitting element 300.

Optionally, with continued reference to FIG. 2, when the notch structure 410 includes the plurality of notch units 411, the plurality of notch units 411 are arranged symmetrically about the light-emitting element 300. Exemplarily, at least one notch unit 411 is symmetrical to another notch unit 411 about the light-emitting element 300. The plurality of notch units 411 arranged symmetrically can ensure that the display panel has consistent luminescence efficiency at various viewing angles, which avoids the following case where the notch unit 411 is disposed in only one direction so that the luminescence efficiency in the one direction is improved, while the notch unit 411 is not disposed in the other direction which is symmetrical about the light-emitting element 300 with the preceding notch unit 411 so that the luminescence efficiency in the other direction is not improved, that is, the light-emitting element 300 has different luminescence efficiency around, which affects the display quality of the display panel.

Figure 5:
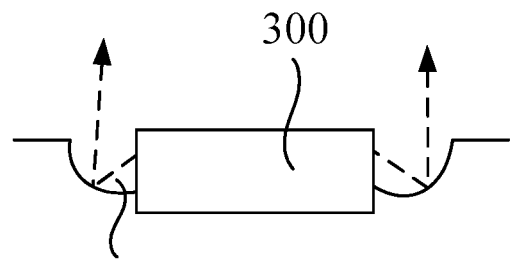
FIG. 5 is a schematic diagram of an optical path in a notch structure of the display panel illustrated in FIG. 1.
Figure 6:
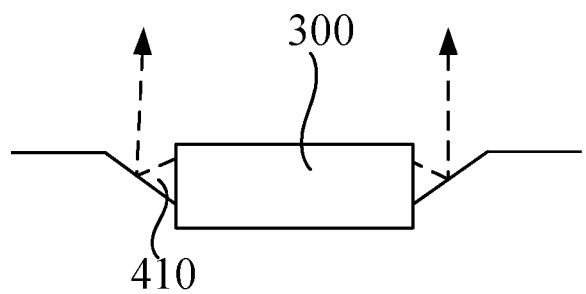
FIG. 6 is a schematic diagram of an optical path in a notch structure of the display panel illustrated in FIG. 3.

FIG. 5 is a schematic diagram of an optical path in a notch structure of the display panel illustrated in FIG. 1. FIG. 6 is a schematic diagram of an optical path in a notch structure of the display panel illustrated in FIG. 3. Referring to FIG. 5 and FIG. 6, the light emitted from a side wall of the light-emitting element 300 may reach the notch structure 410 to be reflected. The reflected light is emitted to the second substrate 200. The notch structure 410 can change the light emitted from the side wall of the light-emitting element 300. The notch structure 410 functions to gather light so that divergent light emitted from the light-emitting element 300 is gathered towards the second substrate 200.

In the display panel provided in the embodiments of the present disclosure, the side light leakage can be reduced through the auxiliary structures surrounding the light-emitting elements so that the optical crosstalk between the adjacent light-emitting elements is reduced, a display contrast ratio is increased, and the display effect is improved.

Moreover, the notch structure is provided on the side of the auxiliary structure close to the light-emitting element and on the side of the auxiliary structure close to the light-emitting surface of the display panel so that the light emitted from the side surface of the light-emitting element can be reflected on the surface of the notch structure and the reflected light can be emitted from the display panel, improving the luminescence efficiency of the light-emitting element and improving the luminescence efficiency of the display panel. The notch structure surrounding the light-emitting element can further improve the luminescence efficiency of the display panel. The auxiliary structures are provided as the entire surface, prepared through a sample technique, and integrally formed so that the process is simplified and the cost is optimized.

With continued reference to FIG. 1, the display panel 100 further includes a first connection portion 510 and a second connection portion 520 between the light-emitting element 300 and the first substrate 100, where a gap exists between the first connection portion 510 and the second connection portion 520.

Figure 7:
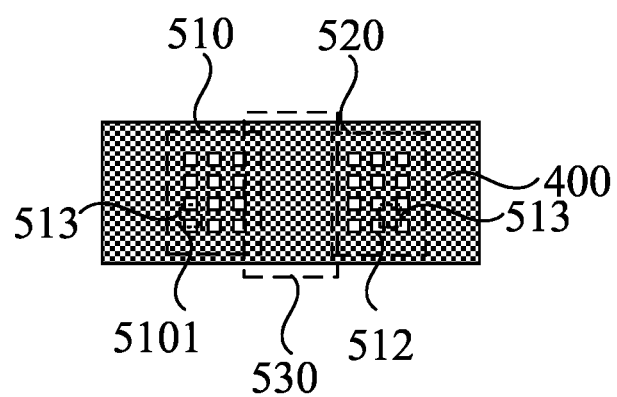
FIG. 7 is a partial structure diagram of a first connection portion, a second connection portion and an auxiliary structure according to an embodiment of the present disclosure.

Exemplarily, the first connection portion 510 and the second connection portion 520 are configured to connect the light-emitting element 300 to the first substrate 100. The first connection portion 510 and the second connection portion 520 are not closely connected to each other. A certain gap 530 is provided between the first connection portion 510 and the second connection portion 520, as shown in FIG. 1. The auxiliary structure 400 may fill the gap 530 between the first connection portion 510 and the second connection portion 520. The notch structure 410 can be formed by use of the gap 530 between the first connection portion 510 and the second connection portion 520. For example, in a certain state, the auxiliary structures 400 have certain fluidity. The auxiliary structure 400 on the side close to the light-emitting element 300 and on the side close to the light-emitting surface of the display panel 10 flows into the gap 530 so that the notch structure 410 is formed. Optionally, the first connection portion 510 is broken into a plurality of islands 5101 and/or the second connection portion 520 is broken into a plurality of islands 512, as shown in FIG. 7. Adjacent islands are spaced apart so that a plurality of gaps are further formed in the display panel such that the auxiliary structure 400 fills not only the gap between the first connection portion 510 and the second connection portion 520 but also gaps 513 between islands. The auxiliary structure 400 on the side close to the light-emitting element 300 and on the side close to the light-emitting surface of the display panel 10 flows into the gaps 513 between adjacent islands, further expanding the notch structure 410.

Optionally, the auxiliary structures 400 may include a black adhesive film or other materials similar to the black adhesive film. The black adhesive film is solid with no fluidity at room temperature. The black adhesive film is pre-heated to have certain fluidity under an external force. Exemplarily, after the plurality of light-emitting elements 300 are arranged, an entire layer of the black adhesive film is provided on all the light-emitting elements 300, and then the black adhesive film is melted. The melted black adhesive film flows around the light-emitting elements 300 and into the gap 530 between the first connection portion 510 and the second connection portion 520. Under the action of gravity, the highest point of the black adhesive film closer to the light-emitting element 300 is lowered so that the notch structure 410 is formed on the side close to the light-emitting element 300 and on the side close to the light-emitting surface of the display panel 10.

Optionally, the auxiliary structures 400 may include an adhesive layer, where the adhesive layer may be, for example, a double-sided adhesive tape. The adhesive layer may be an adhesive film carried on an additional carrier substrate (such as a release film). The adhesive film is attached to the first substrate 100 and then the carrier substrate is peeled off or removed so that the other side of the adhesive layer is exposed.

Exemplarily, the auxiliary structures 400 may be the black adhesive film or a material with a larger refractive index than air. A refractive index of the black adhesive film is 1.54. Since part of a cavity between the first substrate 100 and the second substrate 200 is vacuum or nitrogen (which is only an example in the embodiments of the present disclosure or another filling material whose type is not limited as long as it has a smaller refractive index than an auxiliary material), the refractive index of the cavity may be regarded as 1. Due to a significant difference between the refractive index of the auxiliary structure and the refractive index of the cavity, the light emitted from the side surface of the light-emitting element 300 is reflected upward at the notch structure 410, as shown in FIG. 5 and FIG. 6.

In the display panel according to the present embodiment, the notch structure is formed by utilizing the gap between the first connection portion and the second connection portion when the auxiliary structures are prepared so that the notch structure is prepared using a simple method instead of being etched separately, improving the preparation efficiency of the display panel. Moreover, according to the present embodiment, using the auxiliary structures designed in the present embodiment in combination with the structure of the light-emitting element, the notch structure can be formed autonomously by utilizing the structure of the light-emitting element, simplifying the process and reducing the cost.

Figure 8:
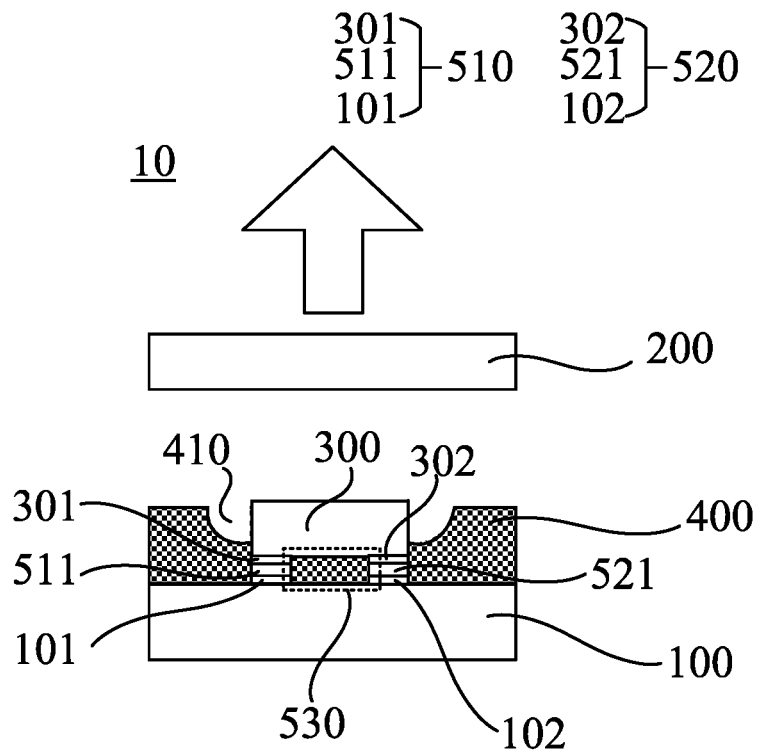
FIG. 8 is a partial structure diagram of another display panel according to an embodiment of the present disclosure.

On the basis of the preceding solution, optionally, FIG. 8 is a partial structure diagram of another display panel according to an embodiment of the present disclosure. Referring to FIG. 8, the display panel 10 includes the first substrate 100, the second substrate 200, the light-emitting elements 300, the auxiliary structures 400 and the notch structures 410, where the light-emitting element 300 includes a first electrode 301 and a second electrode 302, the first substrate 100 is provided with a first electrode connection terminal 101 and a second electrode connection terminal 102, and the display panel 10 further includes a first eutectic unit 511 and a second eutectic unit 521. The first eutectic unit 511 is disposed between the first electrode 301 and the first electrode connection terminal 101 and the second eutectic unit 521 is disposed between the second electrode 302 and the second electrode connection terminal 102.

Exemplarily, the first electrode 301 and the second electrode 302 may be connected to a positive electrode and a negative electrode of the light-emitting element 300. The first electrode 301 may be an anode and the second electrode 302 may be a cathode. Alternatively, the first electrode 301 and the second electrode 302 form the anode, or the first electrode 301 and the second electrode 302 form the cathode. For example, the anode includes multiple island structures, one island structure is the first electrode 301, and another island structure is the second electrode 302. The first electrode 301 and the second electrode 302 are spaced apart from each other.

Exemplarily, the first electrode 301 and the second electrode 302 of the light-emitting element 300 are connected to the first electrode connection terminal 101 and the second electrode connection terminal 102 on the first substrate 100 by the first eutectic unit 511 and the second eutectic unit 521, respectively. After heating, the first electrode 301 is bonded to the first electrode connection terminal 101 by the first eutectic unit 511 and the second electrode 302 is bonded to the second electrode connection terminal 102 by the second eutectic unit 521 so that the light-emitting element 300 is firmly secured to the first substrate 100 and a drive signal can be transmitted to the light-emitting element 300 to drive the light-emitting element 300 to emit light.

At least one of the first electrode 301, the first eutectic unit 511 or the first electrode connection terminal 101 constitutes the first connection portion 510. At least one of the second electrode 302, the second eutectic unit 521 or the second electrode connection terminal 102 constitutes the second connection portion 520. Exemplarily, the first eutectic unit 511 and the second eutectic unit 521 are spaced apart from each other and the first electrode connection terminal 101 and the second electrode connection terminal 102 are also spaced apart from each other. The first electrode 301, the first eutectic unit 511 and the first electrode connection terminal 101 may be connected in correspondence with each other to form the first connection portion 510 and the second electrode 302, the second eutectic unit 521 and the second electrode connection terminal 102 may be connected in correspondence with each other to form the second connection portion 520. Each of the first electrode 301, the first eutectic unit 511 and the first electrode connection terminal 101 may also constitute the first connection portion 510 and any combination of two of the first electrode 301, the first eutectic unit 511 and the first electrode connection terminal 101 may also constitute the first connection portion 510. Each of the second electrode 302, the second eutectic unit 521 and the second electrode connection terminal 102 may also constitute the second connection portion 520 and any combination of two of the second electrode 302, the second eutectic unit 521 and the second electrode connection terminal 102 may also constitute the second connection portion 520.

In the display panel according to the embodiments of the present disclosure, at least one of the first electrode, the first eutectic unit or the first electrode connection terminal constitutes the first connection portion and at least one of the second electrode, the second eutectic unit or the second electrode connection terminal constitutes the second connection portion. When the auxiliary structures are prepared, the notch structure is formed by utilizing the gap between the first connection portion and the second connection portion so that the notch structure is formed using a simple method instead of being etched separately, improving the preparation efficiency of the display panel. Moreover, according to the present embodiment, using the auxiliary structures designed in the present embodiment in combination with the structure of the light-emitting element, the notch structure can be formed autonomously by utilizing the structure of the light-emitting element, simplifying the process and reducing the cost. Additionally, when the first electrode and the second electrode are the positive electrode and the negative electrode of the light-emitting element, the auxiliary structure fills into the gap, so as to avoid a short circuit in the case where the first eutectic unit corresponding to the first electrode is in contact with the second eutectic unit corresponding to the second electrode when they are aligned and laminated with the light-emitting element, where the first electrode and the second electrode are adjacent.

Figure 9:
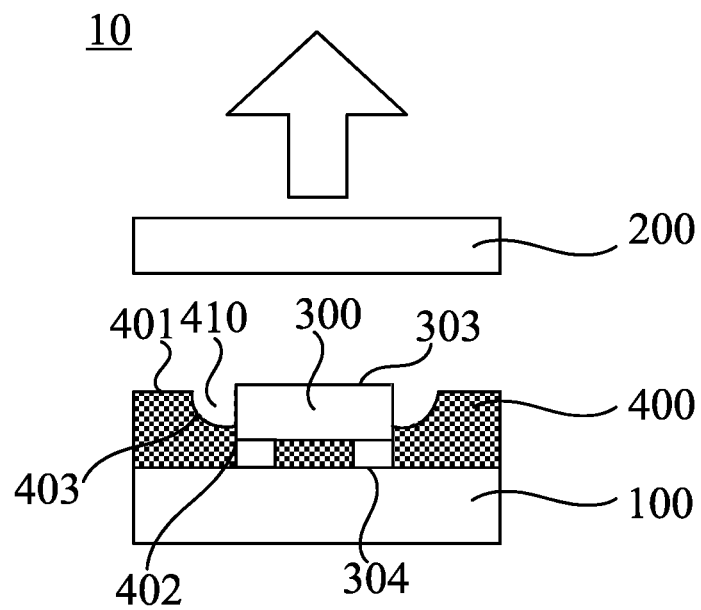
FIG. 9 is a partial structure diagram of another display panel according to an embodiment of the present disclosure.

FIG. 9 is a partial structure diagram of another display panel according to an embodiment of the present disclosure. Referring to FIG. 9, the auxiliary structure 400 includes a top surface 401 and a side wall 402, where the top surface 401 is a surface of the auxiliary structures 400 close to the light-emitting surface of the display panel 10 and the side wall 402 is in contact with the light-emitting element 300. The auxiliary structure 400 includes a notch surface 403 at the notch structure 410. The notch surface 403 is a concave curved surface and the notch surface 403 is connected between the top surface 401 and the side wall 402.

Exemplarily, the notch surface 403 is the concave curved surface formed when the surface of the auxiliary structure 400 at the notch structure 410 recesses towards the interior of the auxiliary structure 400. The notch structure 410 defines a notch on the top surface 401 which would extend transversely to the light-emitting element 300 and the notch structure 410 defines a notch on the side wall 402 which would extend longitudinally to the top surface 401. The auxiliary structure 400 presents the concave curved surface at the notch structure 410, which is connected between the top surface 401 and the side wall 402. The notch surface 403 which is the concave curved surface can converge divergent light, improving the luminescence efficiency of the light-emitting element 300 and reducing the optical crosstalk between adjacent light-emitting elements 300.

On the basis of the preceding embodiments, a reflective layer may be provided on both the top surface 401 and the notch surface 403 which is the concave curved surface. Exemplarily, the reflective layer is provided not only on the notch surface 403 but also on the top surface 401. A metal layer can be coated on all exposed regions (regions with the light-emitting elements 300 are shielded) through a spin-coating technique. A manufacturing technique is less complex and the preparation efficiency is improved. Additionally, the reflective layer is provided on the notch surface 403 so that an optical path of the light emitted from the side surface of the light-emitting element 300 can be changed. At this time, no requirement is imposed on the refractive index of the auxiliary structure 400 and more types of materials can be selected for the auxiliary structure 400, reducing a technique difficulty.

On the basis of the preceding embodiments, with continued reference to FIG. 9, the light-emitting element 300 includes a bottom surface 304 in contact with the first substrate 100 and a top surface 303 facing away from the first substrate 100. A distance from the top surface 401 of the auxiliary structure 400 to the first substrate 100 is less than or equal to a distance from the top surface 303 of the light-emitting element 300 to the first substrate.

Figure 10:
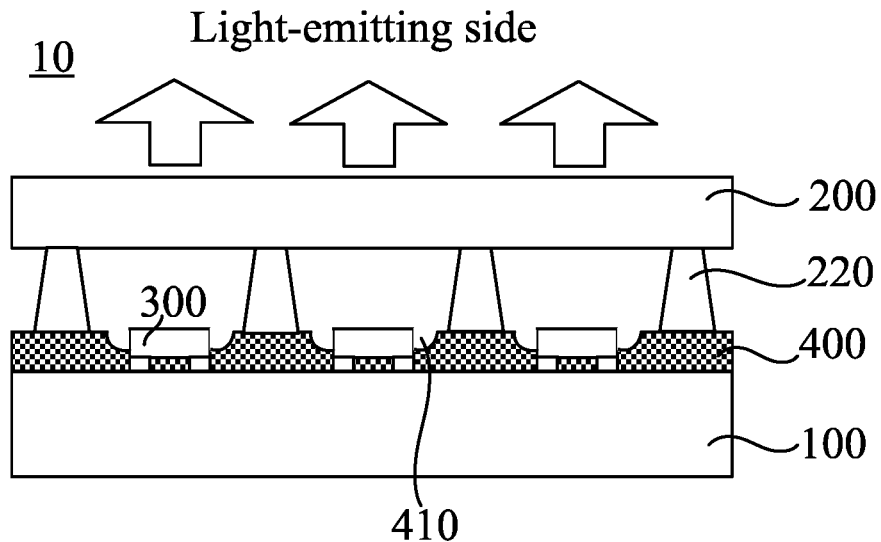
FIG. 10 is a structure diagram of another display panel according to an embodiment of the present disclosure.
Figure 11:
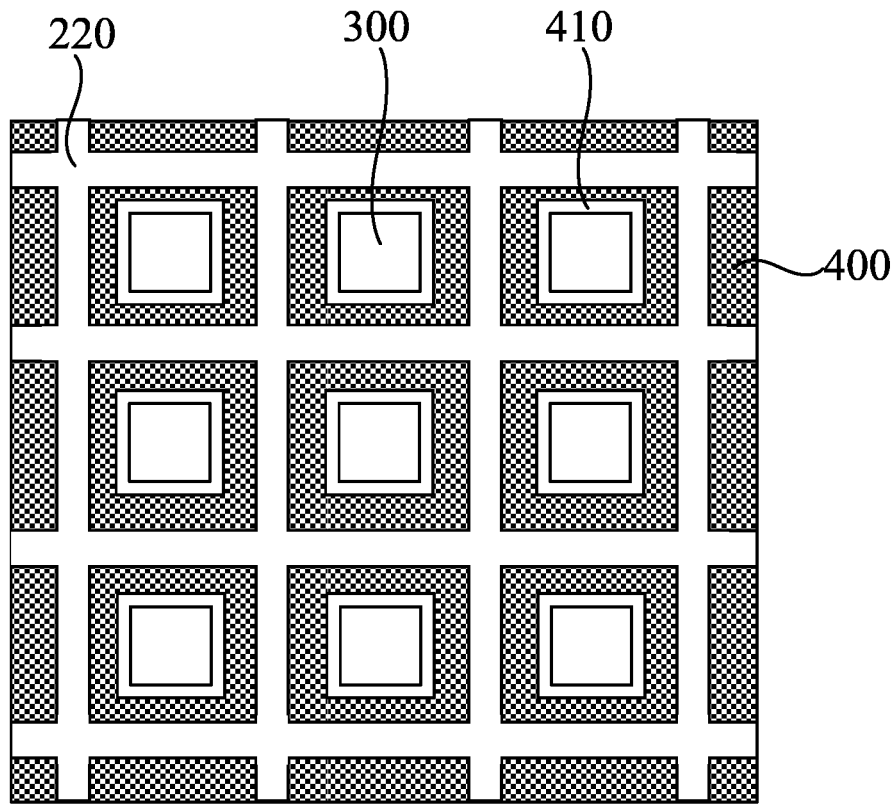
FIG. 11 is a top view of a block wall structure of a display panel according to an embodiment of the present disclosure.

In conjunction with the preceding content and FIG. 1, when the auxiliary structures 400 are prepared, for example, after the plurality of light-emitting elements 300 are arranged, the entire layer of the black adhesive film may be provided on all the light-emitting elements 300, and then the black adhesive film is melted. The melted black adhesive film flows around the light-emitting elements 300 and into the gap 530 between the first connection portion 510 and the second connection portion 520. Under the action of gravity, the highest point of the black adhesive film closer to the light-emitting element 300 is lowered so that the notch structure 410 is formed on the side close to the light-emitting element 300 and on the side close to the light-emitting surface of the display panel 10. If the black adhesive film is too thick, a residual black adhesive film on the light-emitting element 300 will cover the surface of the light-emitting element 300 and shield light emitted by the light-emitting element 300. Therefore, in the present embodiment, an adhesive film with an appropriate thickness is selected so that the melted adhesive film has a lower height than the light-emitting element 300 and when the adhesive film is cured to form the auxiliary structures 400, the distance from the top surface 401 of the auxiliary structure 400 to the first substrate 100 is less than or equal to the distance from the top surface 303 of the light-emitting element 300 to the first substrate. In this manner, the following problems can be avoided: the light emission of the light-emitting element 300 is affected when the top surface 401 of the auxiliary structure 400 is higher than the top surface 303 of the light-emitting element 300 and the light emitted by the light-emitting element 300 is shielded when the auxiliary structure 400 covers the surface of the light-emitting element 300. FIG. 10 is a structure diagram of another display panel according to an embodiment of the present disclosure. FIG. 11 is a top view of a block wall structure in a display panel according to an embodiment of the present disclosure. Referring to FIG. 10 and FIG. 11, the display panel 10 further includes the block wall structure 220 between the adjacent light-emitting elements 300, where an orthogonal projection of the block wall structure on a plane where the first substrate 100 is located is, for example, a grid structure. The orthogonal projection of the block wall structure 220 on the plane where the first substrate 100 is located overlaps an orthogonal projection of the auxiliary structures 400 on the plane where the first substrate 100 is located.

Exemplarily, the block wall structure 220 is disposed on the side of the first substrate 100 close to the light-emitting surface of the display panel 10. The block wall structure 220 can prevent mutual crosstalk between light emitted by the adjacent light-emitting elements 300. Moreover, the block wall structure 220 can avoid the following problem: the display panel 10 cannot provide effective support due to a relatively large gap when it is subjected to an external force, affecting the quality of the display panel.

The orthogonal projection of the block wall structure 220 on the plane where the first substrate 100 is located overlaps the orthogonal projection of the auxiliary structures 400 on the plane where the first substrate 100 is located and the block wall structure 220 is disposed on the side of the auxiliary structures 400 close to the light-emitting surface of the display panel 10. The block wall structure 220 and the auxiliary structures 400 cooperate to prevent light leakage of the light-emitting elements 300, reducing optical crosstalk between light emitted by the adjacent light-emitting elements 300.

On the basis of the preceding embodiments, with continued reference to FIG. 10 and FIG. 11, the orthogonal projection of the block wall structure 220 on the plane where the first substrate 100 is located does not overlap an orthogonal projection of the notch structure 410 on the plane where the first substrate 100 is located. That is, a side of the block wall structure 220 close to the auxiliary structures 400 is not in contact with the notch structure 410 and the block wall structure 220 does not cover the notch structure 410 so that the block wall structure 220 is prevented from shielding light reflected by the notch structure 410 and will not affect the improvement of the luminescence efficiency of the light-emitting element 300 while preventing the mutual crosstalk between the light emitted by the adjacent light-emitting elements 300.

On the basis of the preceding embodiments, with continued reference to FIG. 10 and FIG. 11, the block wall structure 220 may be disposed on the second substrate 200. The benefit of this arrangement is that no gap exists between the block wall structure 220 and the second substrate 200, preventing optical crosstalk caused when light passes through a gap between the block wall structure 220 and the second substrate 200.

Figure 12:
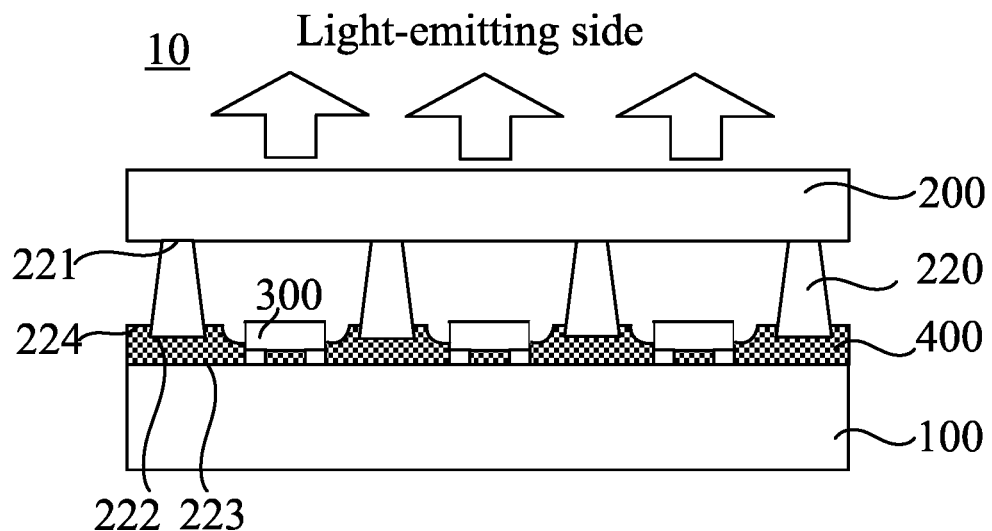
FIG. 12 is a structure diagram of another display panel according to an embodiment of the present disclosure.

Optionally, FIG. 12 is a structure diagram of another display panel according to an embodiment of the present disclosure. Referring to FIG. 12, along a direction vertical to the first substrate 100, the block wall structure 220 includes a first surface 221 and a second surface 222 which are opposite to each other, where the first surface 221 is located on a side of the second surface 222 close to the second substrate 200; and along the direction vertical to the first substrate 100, the auxiliary structures 400 include a third surface 223 and a fourth surface 224 which are opposite to each other, where the third surface 223 is located on a side of the fourth surface 224 close to the first substrate 100. A distance from the second surface 222 to the first substrate 100 is less than or equal to a distance from the fourth surface 224 to the first substrate 100.

Exemplarily, the distance from the second surface 222 to the first substrate 100 is less than or equal to the distance from the fourth surface 224 to the first substrate 100 and an end of the block wall structure 220 facing away from the second substrate 200 is in contact with or embedded in the auxiliary structures 400. In a direction parallel to the first substrate 100, the auxiliary structures 400 overlap a seam, where the seam is a gap between the block wall structure 220 and the first substrate 100.

When the auxiliary structures 400 are the adhesive film, for example, the first substrate 100 may be aligned with and attached to the second substrate 200 before the auxiliary structures 400 are cured so that the block wall structure 220 on the second substrate 200 is embedded in the auxiliary structures 400 and then the auxiliary structures 400 are cured.

In the display panel according to the embodiments of the present disclosure, the block wall structure 220 is embedded in the auxiliary structures 400, that is, there is no gap between the auxiliary structures 400 and the block wall structure 220 in the direction parallel to the first substrate 100. The combination of the auxiliary structures 400 and the block wall structure 220 can completely shield light emitted from the top surface and the side surface of the light-emitting element 300, avoiding mutual crosstalk between light-emitting elements 300 in the display panel. Moreover, the light emitted from the side surface of the light-emitting element is utilized effectively by the notch structure 410, improving the display effect of the display panel. Further, the auxiliary structures 400 can also provide a certain alignment support force to assist in supporting the block wall structure 220, providing a certain buffer for alignment and attaching.

Figure 13:
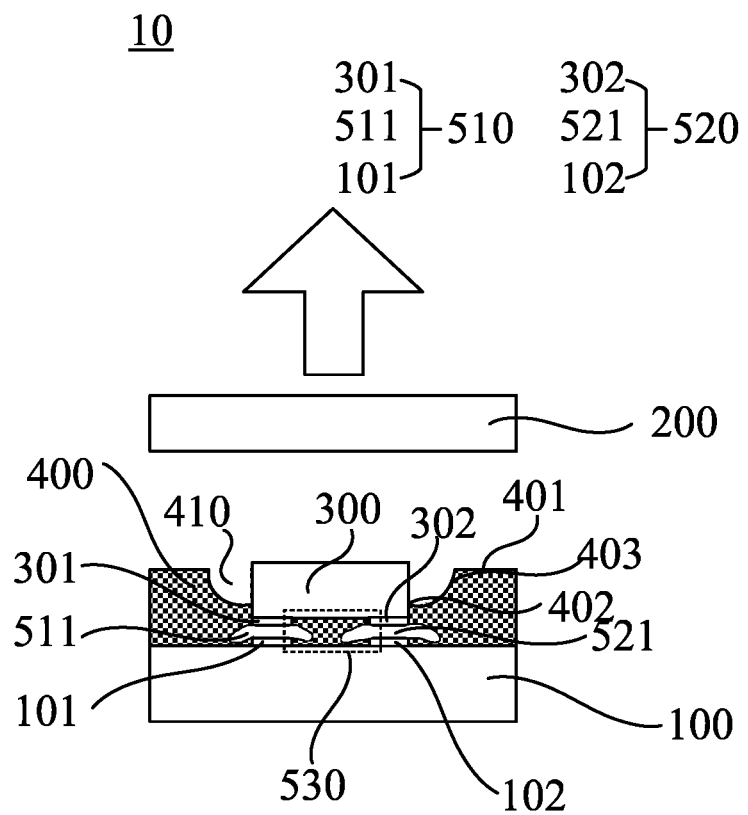
FIG. 13 is a partial structure diagram of another display panel according to an embodiment of the present disclosure.

Optionally, FIG. 13 is a partial structure diagram of another display panel according to an embodiment of the present disclosure. Referring to FIG. 13, the light-emitting element 300 includes the first electrode 301, the first electrode connection terminal 101 is disposed on the first substrate 100, and the display panel 10 further includes the first eutectic unit 511. The first eutectic unit 511 is disposed between the first electrode 301 and the first electrode connection terminal 101. Optionally, with continued reference to FIG. 13, the light-emitting element 300 further includes the second electrode 302, the second electrode connection terminal 102 is disposed on the first substrate 100, and the display panel 10 further includes the second eutectic unit 521. The second eutectic unit 521 is disposed between the second electrode 302 and the second electrode connection terminal 102.

Exemplarily, the first electrode 301 may be the anode of the light-emitting element 300 and the second electrode 302 may be the cathode of the light-emitting element 300, or the first electrode 301 may be the cathode of the light-emitting element 300 and the second electrode 302 may be the anode of the light-emitting element 300. The first electrode 301 of the light-emitting element 300 is connected to the first electrode connection terminal 101 on the first substrate 100 by the first eutectic unit 511 and the second electrode 302 of the light-emitting element 300 is connected to the second electrode connection terminal 102 on the first substrate 100 by the second eutectic unit 521. After heating, the first electrode 301 is bonded to the first electrode connection terminal 101 by the first eutectic unit 511 and the second electrode 302 is bonded to the second electrode connection terminal 102 by the second eutectic unit 521 so that the light-emitting element 300 is firmly secured to the first substrate 100.

With continued reference to FIG. 13, at least one of the first electrode 301, the first eutectic unit 511 or the first electrode connection terminal 101 constitutes the first connection portion 510; and at least one of the second electrode 302, the second eutectic unit 521 or the second electrode connection terminal 102 constitutes the second connection portion 520. The first electrode 301, the first eutectic unit 511 and the first electrode connection terminal 101 may be connected in correspondence with each other to form the first connection portion 510. Each of the first electrode 301, the first eutectic unit 511 and the first electrode connection terminal 101 may also constitute the first connection portion 510 and any combination of two of the first electrode 301, the first eutectic unit 511 and the first electrode connection terminal 101 may also constitute the first connection portion 510. The same applies to the second connection portion 520. FIG. 13 illustrates an example in which the first electrode 301, the first eutectic unit 511 and the first electrode connection terminal 101 constitute the first connection portion 510 and the second electrode 302, the second eutectic unit 521 and the second electrode connection terminal 102 constitute the second connection portion 520.

With continued reference to FIG. 13, the auxiliary structure 400 includes the top surface 401 and the side wall 402, where the top surface 401 is the surface of the auxiliary structure 400 close to the light-emitting surface of the display panel 10 and the side wall 402 is in contact with the light-emitting element 300. The auxiliary structure 400 includes the notch surface 403 at the notch structure 410. The notch surface 403 is the concave curved surface and the notch surface 403 connects the top surface 401 and the side wall 402. Exemplarily, the notch surface 403 is the concave curved surface formed when the surface of the auxiliary structure 400 at the notch structure 410 recesses towards the interior of the auxiliary structure 400. The notch structure 410 defines the notch on the top surface 401 which would extend transversely to the light-emitting element 300 and the notch structure 410 defines the notch on the side wall 402 which would extend longitudinally to the top surface 401. The auxiliary structure 400 presents the concave curved surface at the notch structure 410, which is connected between the top surface 401 and the side wall 402. The notch surface 403, which is the concave curved surface, can converge divergent light, reducing the optical crosstalk between the adjacent light-emitting elements 300.

With continued reference to FIG. 13, a distance from an end of the notch structure 410 at the side wall 402 to the first substrate 100 is greater than a distance from the first connection portion 510 to the first substrate 100. Considering that the first electrode 301, the first eutectic unit 511 and the first electrode connection terminal 101 are generally metals and the metals can reflect light, when light is irradiated to at least one of the first electrode 301, the first eutectic unit 511 or the first electrode connection terminal 101, the light is reflected so that at least one of the first electrode 301, the first eutectic unit 511 or the first electrode connection terminal 101 can be seen on a light-emitting side of the display panel. Therefore, in the embodiments of the present disclosure, the distance from the end of the notch structure 410 at the side wall 402 to the first substrate 100 is configured to be greater than the distance from the first connection portion 510 to the first substrate 100 so that the auxiliary structure 400 shields the first connection portion 510, preventing the first connection portion 510 from being seen on the light-emitting side of the display panel and improving the display effect of the display panel. Further, the first eutectic unit 511 needs to be heated to be bonded to the first electrode 301 and the first electrode connection terminal 101, the heated first eutectic unit 511 is softened and squeezed, and the squeezed first eutectic unit 511 collapses towards the first substrate and has an irregular shape and an uneven surface. As shown in FIG. 13, the first eutectic unit 511 has a slope-shaped surface which can further reflect light so that the first eutectic unit 511 can be seen on the light-emitting side of the display panel. Therefore, in the present embodiment, the distance from the end of the notch structure 410 at the side wall 402 to the first substrate 100 is preferably configured to be at least greater than a distance from the first eutectic unit 511 to the first substrate 100, preventing the first eutectic unit 511 from being seen on the light-emitting side of the display panel. Optionally, the distance from the end of the notch structure 410 at the side wall 402 to the first substrate 100 is greater than a distance from the second connection portion 520 to the first substrate 100. Considering that the second electrode 302, the second eutectic unit 521 and the second electrode connection terminal 102 are generally metals and the metals can reflect light, when light is irradiated to at least one of the second electrode 302, the second eutectic unit 521 or the second electrode connection terminal 102, the light is reflected so that at least one of the second electrode 302, the second eutectic unit 521 or the second electrode connection terminal 102 can be seen on the light-emitting side of the display panel. Therefore, in the embodiments of the present disclosure, the distance from the end of the notch structure 410 at the side wall 402 to the first substrate 100 is configured to be greater than the distance from the second connection portion 520 to the first substrate 100 so that the auxiliary structure 400 shields the second connection portion 510, preventing the first connection portion 510 from being seen on the light-emitting side of the display panel and improving the display effect of the display panel. Further, the second eutectic unit 521 needs to be heated to be bonded to the second electrode 302 and the second electrode connection terminal 102, the heated second eutectic unit 521 is softened and squeezed, and the squeezed second eutectic unit 521 collapses towards the first substrate and has an irregular shape and an uneven surface. As shown in FIG. 13, the second eutectic unit 521 has a sloped-shaped surface, which can further reflect light so that the second eutectic unit 521 can be seen on the light-emitting side of the display panel. Therefore, in the present embodiment, the distance from the end of the notch structure 410 at the side wall 402 to the first substrate 100 needs to be configured to be at least greater than a distance from the second eutectic unit 521 to the first substrate 100, preventing the second eutectic unit 521 from being seen on the light-emitting side of the display panel.

Figure 14:
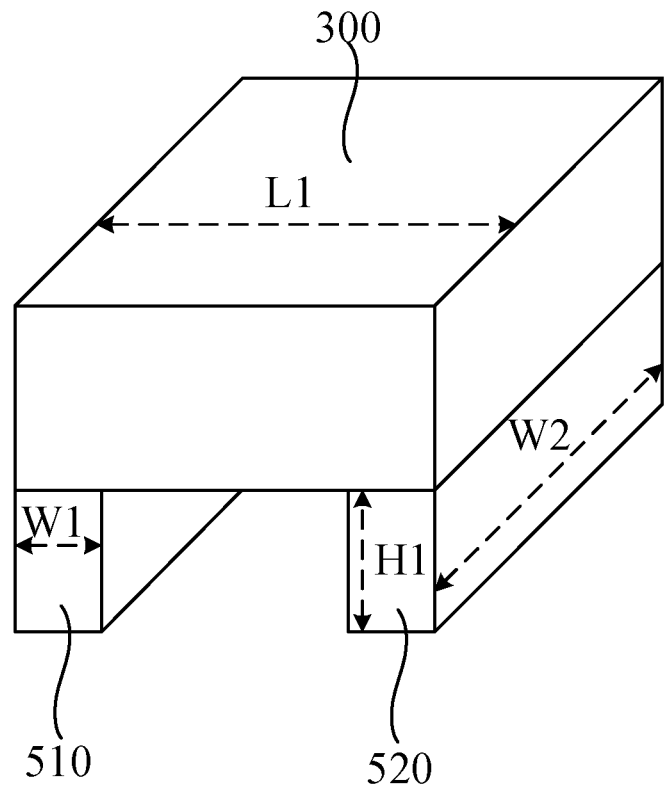
FIG. 14 is a structure diagram of a light-emitting element according to an embodiment of the present disclosure.

Optionally, FIG. 14 is a structure diagram of a light-emitting element according to an embodiment of the present disclosure. Referring to FIG. 1 and FIG. 14, the light-emitting element 300 has a length of L1; the first connection portion 510 and the second connection portion 520 have the same length W1; the first connection portion 510 and the second connection portion 520 have the same width W2; and the first connection portion 510 and the second connection portion 520 have the same height H1. A volume of the gap between the first connection portion 510 and the second connection portion 520 is (L1−2W1)×W2×H1. A volume of the notch structure 410 is V0. The total volume of the notch structure 410 and a size of the light-emitting element 300 satisfy the following relationship: V0≤(L1−2W1)×W2×H1.

Exemplarily, it will be appreciated from the preceding description that when the auxiliary structures 400 are prepared, for example, after the plurality of light-emitting elements 300 are arranged, the entire layer of the black adhesive film may be provided on all the light-emitting elements 300, and then the black adhesive film is melted. The melted black adhesive film flows around the light-emitting elements 300 and into the gap between the first connection portion 510 and the second connection portion 520. The melted black adhesive film can fill the gap and surround the first connection portion 510 and the second connection portion 520 to cover and coat the first connection portion 510 and the second connection portion 520. Therefore, the volume of the notch structure 410 is generally less than or equal to the volume of the gap between the first connection portion 510 and the second connection portion 520.

Figure 15:
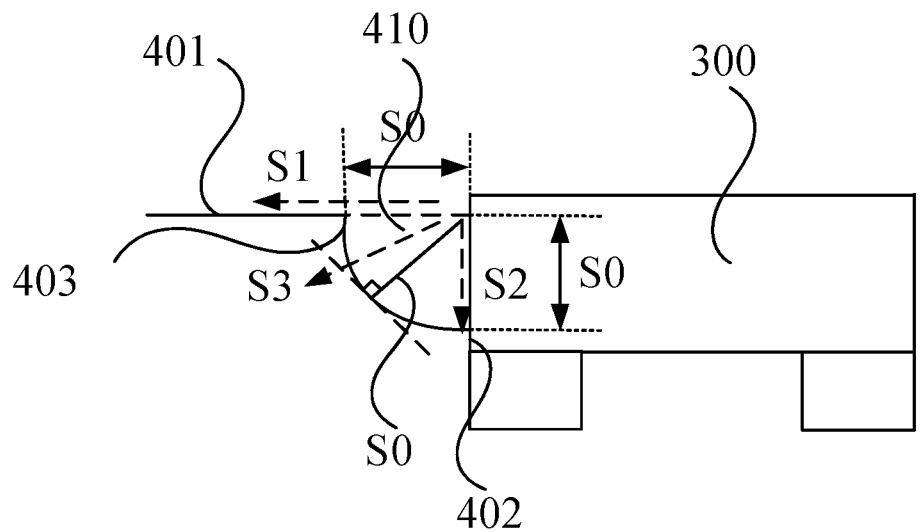
FIG. 15 is a schematic diagram of a notch structure according to an embodiment of the present disclosure.

Optionally, FIG. 15 is a schematic diagram of a notch structure according to an embodiment of the present disclosure. Referring to FIG. 12 and FIG. 15, the notch structure 410 extends along a first direction S1, a second direction S2 and a third direction S3, where the first direction S1 is parallel to the first substrate 100, the second direction S2 is vertical to the first substrate 100, and the third direction S3 has a first angle with the first direction S1. Along a direction vertical to a tangent to an extension direction of the notch structure 410, a size of the notch structure is S0, where 0.5 μm≤S0≤5 μm.

Exemplarily, the first direction S1 is a direction parallel to the first substrate 100 and from the light-emitting element 300 to the auxiliary structure 400, the second direction S2 is a direction vertical to the first substrate 100 and from the second substrate 200 to the first substrate 100, and the third direction S3 has the first angle with the first direction S1, where the first angle may be any angle greater than 0° and less than 90°. When the notch structure 410 is formed by the preceding method, the notch structure 410 extends along the direction from the second substrate 200 to the first substrate 100 (the second direction S2 in FIG. 15), the direction from the light-emitting element 300 to the auxiliary structure 400 (the first direction S1 in FIG. 15) and all directions between the second direction S2 and the first direction S1 (the third direction S3). A closest distance from a tangent to the extension direction to the side wall of the light-emitting element 300 is the size S0 of the notch structure 410 in all directions. Due to the limited gap between the first connection portion 510 and the second connection portion 520, S0 satisfies that 0.5 μm≤S0≤5 μm.

Figure 16:
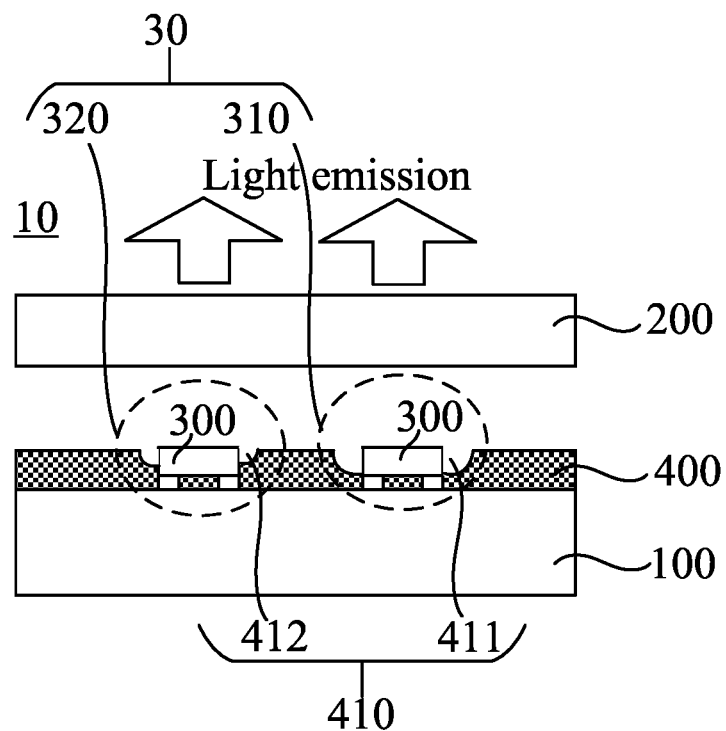
FIG. 16 is a partial structure diagram of another display panel according to an embodiment of the present disclosure.

On the basis of the preceding embodiments, optionally, FIG. 16 is a partial structure diagram of another display panel according to an embodiment of the present disclosure. Referring to FIG. 16, the first substrate 100 includes a plurality of sub-pixel regions 30 and the plurality of light-emitting elements 300 are in a one-to-one correspondence with the plurality of sub-pixel regions 30. The sub-pixel regions 30 include a first color sub-pixel region 310 and a second color sub-pixel region 320. The first color sub-pixel region 310 has lower luminescence efficiency than the second color sub-pixel region 320. The notch structure 410 corresponding to the first color sub-pixel region 310 is a first notch structure 411 and the notch structure 410 corresponding to the second color sub-pixel region 320 is a second notch structure 412. The extension direction of the notch structure 410 is parallel to the first substrate 100. Along the direction vertical to the tangent to the extension direction of the notch structure 410, the first notch structure 411 has a larger size than the second notch structure 412.

Considering that sub-pixel regions 30 of different colors have different luminescence efficiency, for example, a sub-pixel region emitting blue light has lower luminescence efficiency than a sub-pixel region emitting green light, the display effect of the display panel is affected. The notch structure 410 can improve the luminescence efficiency of the light-emitting element 300 corresponding to a sub-pixel region and further improve the luminescence efficiency of the sub-pixel region. Therefore, in the present solution, when the light-emitting element 300 corresponding to the first color sub-pixel region 310 has lower luminescence efficiency than the light-emitting element 300 corresponding to the second color sub-pixel region 320, the luminescence efficiency of the first color sub-pixel region 310 with the lower luminescence efficiency can be improved through an increased size of the first notch structure 411. The size of the first notch structure 411 is increased so that more light emitted from the side surface of the light-emitting element 300 can be reflected towards the second substrate 200 on a surface of the first notch structure 411, improving the luminescence efficiency of the light-emitting element 300 corresponding to the first color sub-pixel region 310. In this manner, the first color sub-pixel region 310 and the second color sub-pixel region 320 tend to have consistent luminescence efficiency so that the luminescence efficiency of the sub-pixel regions is balanced, further improving the display quality of the display panel 10.

It is to be noted that the above example only illustrates that the sub-pixel regions 30 include the first color sub-pixel region 310 and the second color sub-pixel region 320 and the first color sub-pixel region 310 has lower luminescence efficiency than the second color sub-pixel region 320. In other optional embodiments, the plurality of sub-pixel regions 30 may also include a first color sub-pixel region, a second color sub-pixel region and a third color sub-pixel region. When the three sub-pixel regions have different luminescence efficiency, the size of the notch structure may be changed so that the three sub-pixel regions tend to have consistent luminescence efficiency. A specific principle thereof is the same as that of the above example and is not repeated here.

Figure 17:
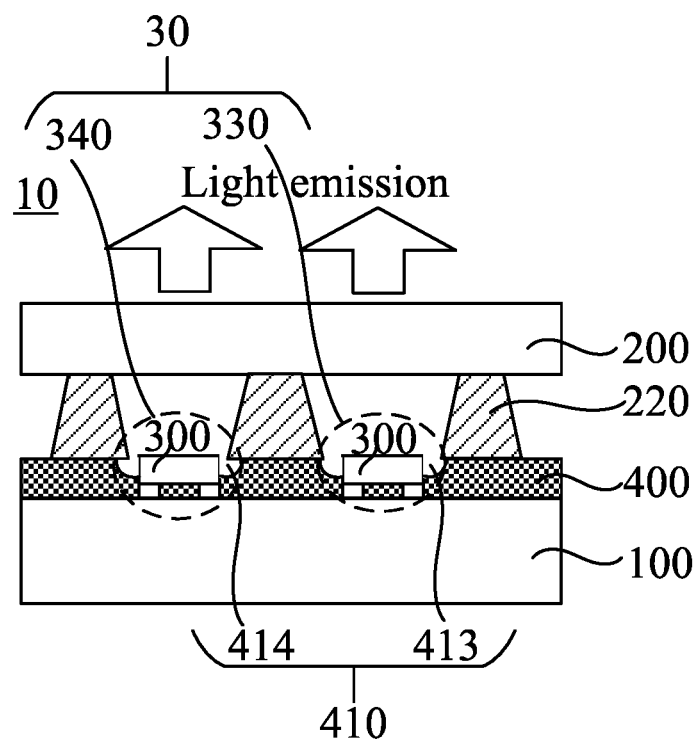
FIG. 17 is a partial structure diagram of another display panel according to an embodiment of the present disclosure.
Figure 18:
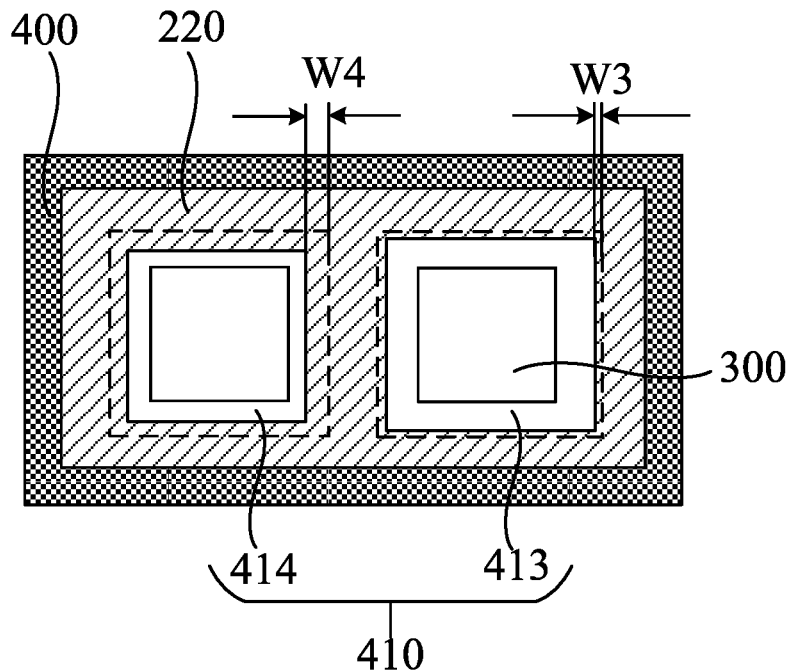
FIG. 18 is a top view of part of a block wall structure of a display panel according to an embodiment of the present disclosure.

Optionally, FIG. 17 is a partial structure diagram of another display panel according to an embodiment of the present disclosure and FIG. 18 is a top view of part of a block wall structure of a display panel according to an embodiment of the present disclosure. Referring to FIG. 17 and FIG. 18, the first substrate 100 includes the plurality of sub-pixel regions 30 and the plurality of light-emitting elements 300 are in a one-to-one correspondence with the plurality of sub-pixel regions 30. The sub-pixel regions 30 include a first color sub-pixel region 330 and a second color sub-pixel region 340. The notch structure 410 corresponding to the first color sub-pixel region 330 is a first notch structure 413 and the notch structure 410 corresponding to the second color sub-pixel region 340 is a second notch structure 414.

The first color sub-pixel region 330 has lower luminescence efficiency than the second color sub-pixel region 340. An orthogonal projection of the block wall structure 220 corresponding to the first color sub-pixel region 330 on the plane where the first substrate 100 is located overlaps an orthogonal projection of the first notch structure 413 on the plane where the first substrate 100 is located by a first width W3. An orthogonal projection of the block wall structure 220 corresponding to the second color sub-pixel region 340 on the plane where the first substrate 100 is located overlaps an orthogonal projection of the second notch structure 414 on the plane where the first substrate 100 is located by a second width W4. The first width W3 is less than the second width W4.

Exemplarily, the block wall structure 220 corresponding to the first color sub-pixel region 330 covers and shields part of the first notch structure 413 corresponding to the first color sub-pixel region 330 and the block wall structure 220 corresponding to the second color sub-pixel region 340 covers and shields part of the second notch structure 414 corresponding to the second color sub-pixel region 340. When the notch structure 410 is shielded, part of the light emitted from the side surface of the light-emitting element 300 will be shielded by the block wall structure 220 and cannot be emitted towards the second substrate 200, reducing the luminescence efficiency. The first width W3 is less than the second width W4, which indicates that the block wall structure 220 corresponding to the first color sub-pixel region 330 shields the first notch structure 413 corresponding to the first color sub-pixel region 330 less significantly and the luminescence efficiency of the first color sub-pixel region 330 is reduced to a smaller degree. The second width W4 is greater than the first width W3, which indicates that the block wall structure 220 corresponding to the second color sub-pixel region 340 shields the second notch structure 414 corresponding to the second color sub-pixel region 340 to a larger degree and the luminescence efficiency of the second color sub-pixel region 340 is decreased more significantly. The first color sub-pixel region 330 has the lower luminescence efficiency than the second color sub-pixel region 340, for example, the sub-pixel region emitting blue light has lower luminescence efficiency than a sub-pixel region emitting red light and the sub-pixel region emitting red light has lower luminescence efficiency than the sub-pixel region emitting green light. The first width W3 is less than the second width W4 so that a difference between the luminescence efficiency of the first color sub-pixel region 330 and the luminescence efficiency of the second color sub-pixel region 340 can be balanced and the display panel 10 emits more uniform light, improving the display quality of the display panel 10.

It is to be noted that the above example only illustrates that the sub-pixel regions 30 include the first color sub-pixel region 310 and the second color sub-pixel region 320 and the first color sub-pixel region 310 has the lower luminescence efficiency than the second color sub-pixel region 320. In other optional embodiments, the plurality of sub-pixel regions may further also the first color sub-pixel region, the second color sub-pixel region and the third color sub-pixel region. When the three sub-pixel regions have different luminescence efficiency, the width by which the orthogonal projection of the block wall structure corresponding to the sub-pixel region on the plane where the first substrate is located overlaps the orthogonal projection of the notch structure on the plane where the first substrate is located so that the three sub-pixel regions tend to have consistent luminescence efficiency. The specific principle thereof is the same as that of the above example and is not repeated here.

Figure 19:
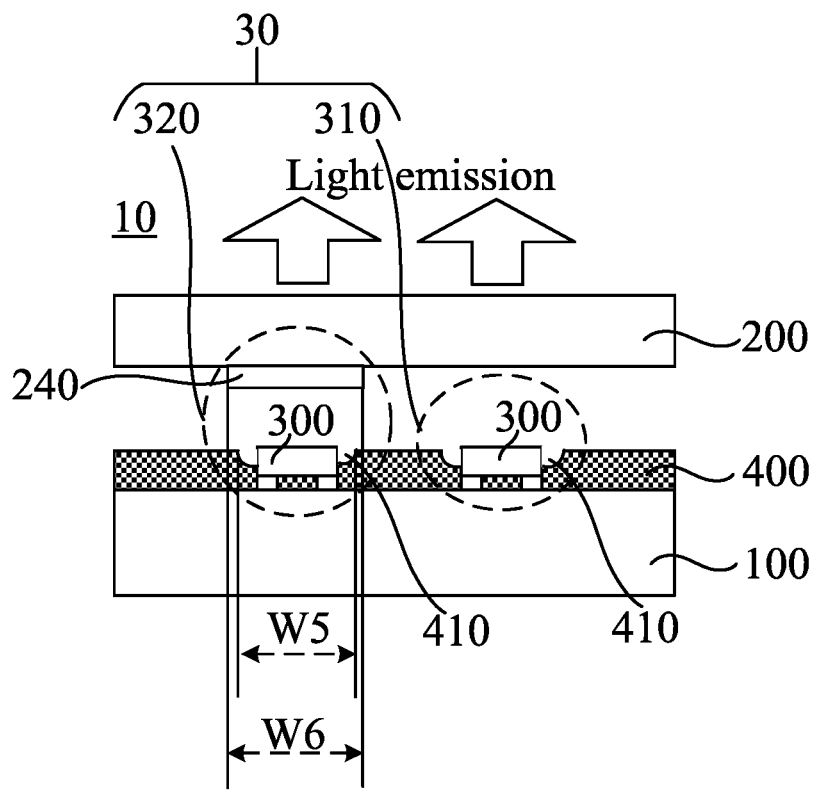
FIG. 19 is a partial structure diagram of another display panel according to an embodiment of the present disclosure.

Optionally, FIG. 19 is a partial structure diagram of another display panel according to an embodiment of the present disclosure. Referring to FIG. 19, the first substrate includes the plurality of sub-pixel regions 30 and the plurality of light-emitting elements 300 are in a one-to-one correspondence with the plurality of sub-pixel regions 30. At least part of the sub-pixel regions 30 further includes the color conversion layer. The plurality of light-emitting elements 300 all emit light of a first color. The plurality of sub-pixel regions 30 include the first color sub-pixel region 310 and the second color sub-pixel region 320, where the second color sub-pixel region 320 includes the color conversion layer. The orthogonal projection of the notch structure 410 on the plane where the first substrate 100 is located is located within an orthogonal projection of the color conversion layer on the plane where the first substrate 100 is located.

It will be appreciated from the above description that the color conversion layer may include, for example, the film with the color conversion function such as the quantum dot layer or the fluorescent material layer. FIG. 19 illustrates an example in which the color conversion layer is the quantum dot layer 240.

Exemplarily, the first color sub-pixel region 310 may emit the light of the first color and the second color sub-pixel region 320 may emit light of a color different from the first color. A width W5 of the notch structure 410 is less than a width W6 of the quantum dot layer 240. In this case, the orthogonal projection of the notch structure 410 on the plane where the first substrate 100 is located is located within the orthogonal projection of the quantum dot layer 240 on the plane where the first substrate 100 is located so that the light emitted by the light-emitting element 300 corresponding to the second color sub-pixel region 320 can be emitted towards the quantum dot layer 240 as much as possible, improving light conversion efficiency of the second color sub-pixel region 320, the luminescence efficiency of the display panel 10 and the display quality of the display panel 10.

Figure 20:
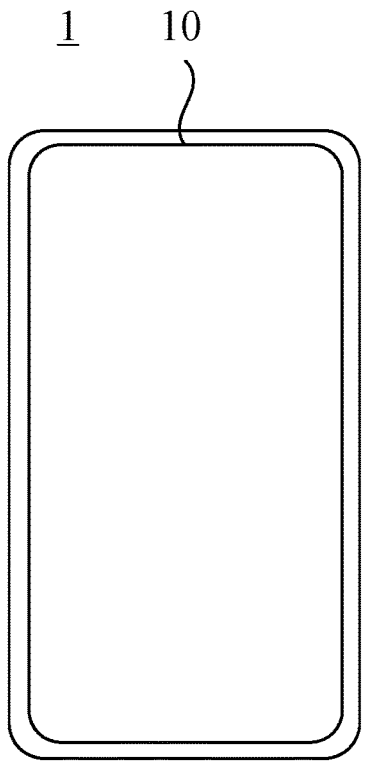
FIG. 20 is a structure diagram of a display device according to an embodiment of the present disclosure.

An embodiment of the present disclosure further provides a display device. FIG. 20 is a structure diagram of a display device according to an embodiment of the present disclosure. A display device 1 includes the display panel 10 according to any one of the preceding embodiments so that the display device 1 has the same beneficial effects as the preceding display panel. Similarities may be understood with reference to the preceding description of the display panel and are not repeated here. The display device provided by the embodiment of the present disclosure may be a phone shown in FIG. 20 or may be any electronic product with a display function, which includes, but is not limited to, the following categories: a television, a laptop, a desktop display, a tablet computer, a digital camera, a smart bracelet, smart glasses, a vehicle-mounted display, a medical device, an industrial control device, a touch interactive terminal and the like, which is not particularly limited in the embodiments of the present disclosure.

Figure 21:
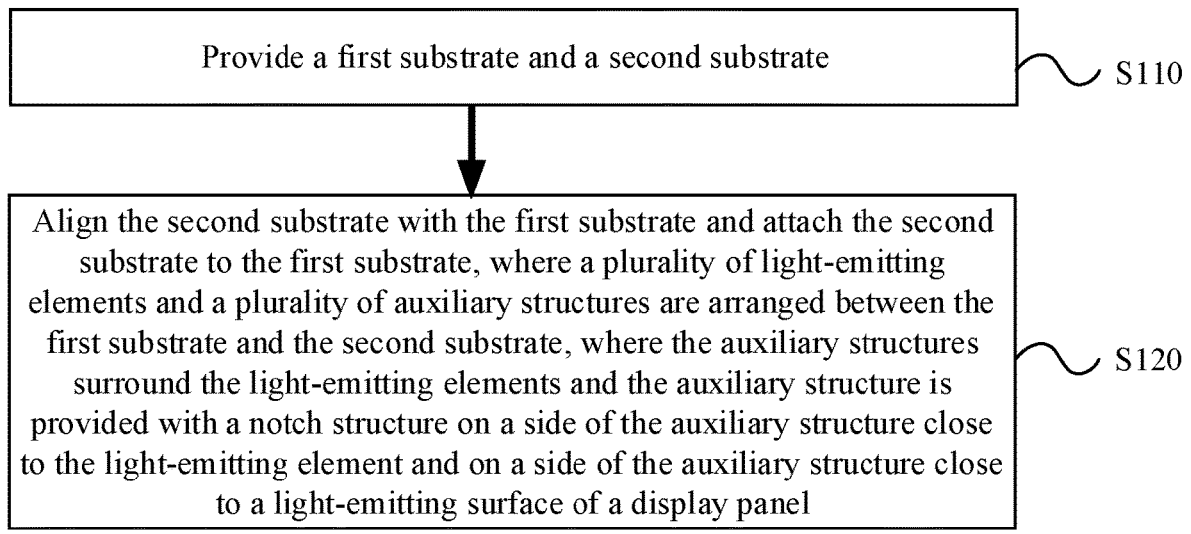
FIG. 21 is a flowchart of a preparation method of a display panel according to an embodiment of the present disclosure.

An embodiment of the present disclosure further provides a preparation method of a display panel. The preparation method of the display panel is used for preparing the display panel according to the embodiments of the present disclosure and has the same beneficial effects as the display panel in the preceding embodiments. Similarities may be understood with reference to the preceding explanation and description of the display panel and are not repeated below. FIG. 21 is a flowchart of a preparation method of a display panel according to an embodiment of the present disclosure. As shown in FIG. 21, the preparation method includes the steps described below.

In S110, a first substrate and a second substrate are provided.

In S120, the second substrate is aligned with and attached to the first substrate, where a plurality of light-emitting elements and a plurality of auxiliary structures are arranged between the first substrate and the second substrate. The auxiliary structures surround the light-emitting elements and the auxiliary structure is provided with a notch structure on a side of the auxiliary structure close to the light-emitting element and on a side of the auxiliary structure close to a light-emitting surface of the display panel.

Exemplarily, the light-emitting elements and the auxiliary structures may be prepared in different sequences. For example, the auxiliary structures may be prepared firstly, the notch structures on the auxiliary structures and openings arranged in a one-to-one correspondence with the light-emitting elements are prepared by a method such as etching, and then the light-emitting elements are placed in the openings. The light-emitting elements may also be placed or prepared firstly, the auxiliary structures are prepared, and then the notch structures are formed on the auxiliary structures. The light-emitting elements and the auxiliary structures may be prepared in different orders and by various methods, which are not limited in the embodiments of the present disclosure.

By using the preparation method of the display panel provided by the embodiments of the present disclosure, side light leakage can be reduced through the auxiliary structures surrounding the light-emitting elements so that optical crosstalk between adjacent light-emitting elements is reduced, a display contrast ratio is increased, and a display effect is improved. Moreover, the notch structure is provided on the side of the auxiliary structure close to the light-emitting element so that light emitted from a side surface of the light-emitting element can be reflected on a surface of the notch structure and the reflected light can be emitted from the display panel, improving the luminescence efficiency of the light-emitting element and improving the luminescence efficiency of the display panel. The notch structure surrounding the light-emitting element can further improve the luminescence efficiency of the display panel. The auxiliary structures are provided as an entire surface, prepared through a sample technique, and integrally formed so that a process is simplified and a cost is optimized.

Figure 22:
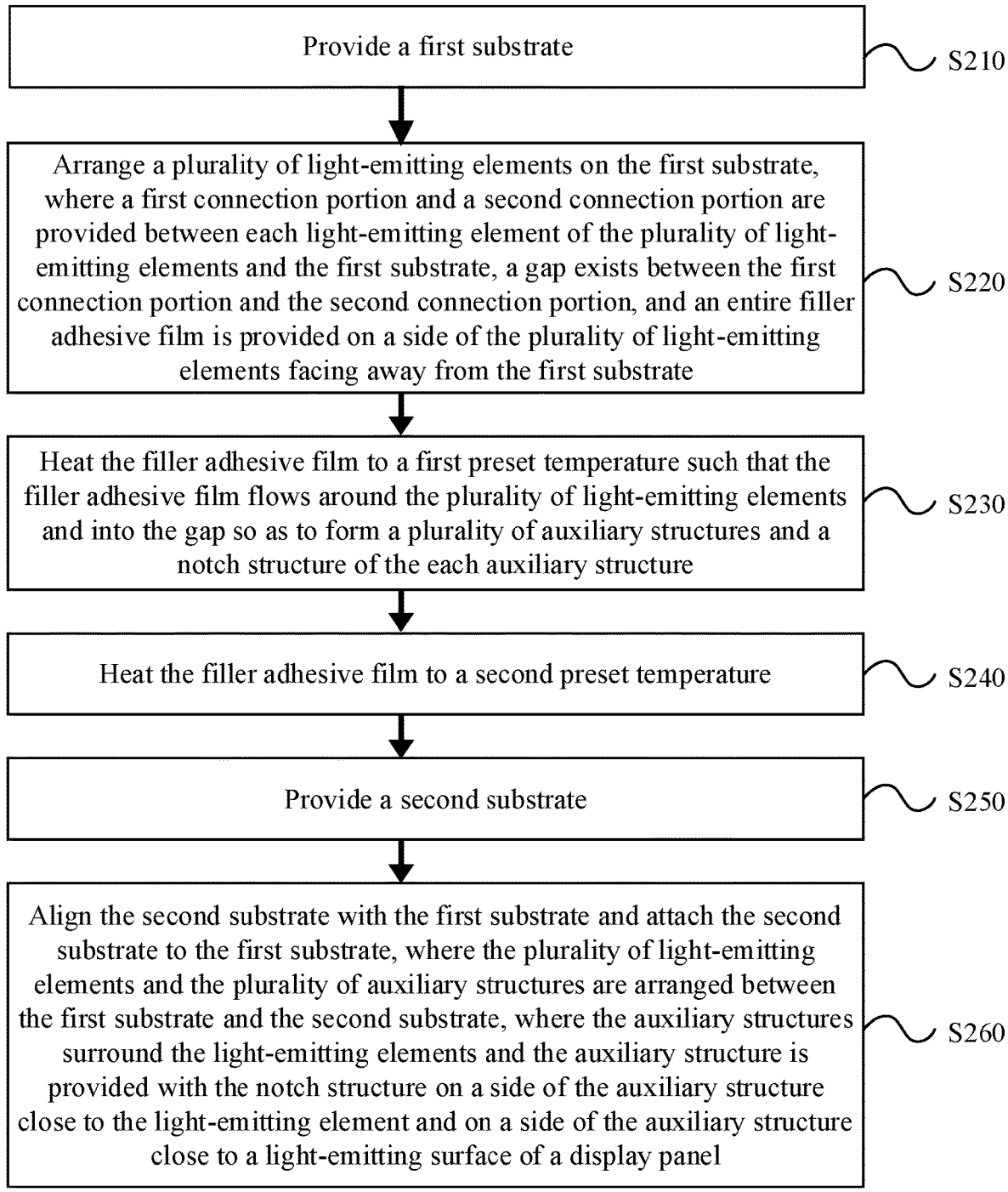
FIG. 22 is a flowchart of another preparation method of a display panel according to an embodiment of the present disclosure.

Optionally, the preparation method of the display panel further includes techniques and methods for the light-emitting elements, connection portions and the auxiliary structures. FIG. 22 is a flowchart of another preparation method of a display panel according to an embodiment of the present disclosure. As shown in FIG. 22, the preparation method includes the steps described below.

In S210, the first substrate is provided.

In S220, the plurality of light-emitting elements are arranged on the first substrate, where a first connection portion and a second connection portion are provided between the light-emitting element and the first substrate a gap exists between the first connection portion and the second connection portion, and an entire filler adhesive film is provided on a side of the light-emitting elements facing away from the first substrate.

In S230, the filler adhesive film is heated to a first preset temperature such that the filler adhesive film flows around the light-emitting elements and into the gap so as to form the auxiliary structures and the notch structure of the auxiliary structure.

In S240, the filler adhesive film is heated to a second preset temperature.

In S250, the second substrate is provided.

In S260, the second substrate is aligned with and attached to the first substrate, where the plurality of light-emitting elements and the plurality of auxiliary structures are arranged between the first substrate and the second substrate. The auxiliary structures surround the light-emitting elements and the auxiliary structure is provided with the notch structure on the side of the auxiliary structure close to the light-emitting element and on the side of the auxiliary structure close to the light-emitting surface of the display panel.

Exemplarily, a surface of the light-emitting elements on the first substrate is covered with the entire filler adhesive film. The filler adhesive film has certain fluidity after heated. The first preset temperature may be 90° C. The filler adhesive film is heated to 90° C. and has certain fluidity. The filler adhesive film covering the surface of the light-emitting elements flows around the light-emitting elements so that the auxiliary structures are formed. The filler adhesive film close to the periphery of the light-emitting element flows into the gap between the first connection portion and the second connection portion so that the notch structure is formed around the light-emitting element.

Exemplarily, the second preset temperature may be 150° C. At 150° C., the filler adhesive film will be completely cured.

Figure 23:
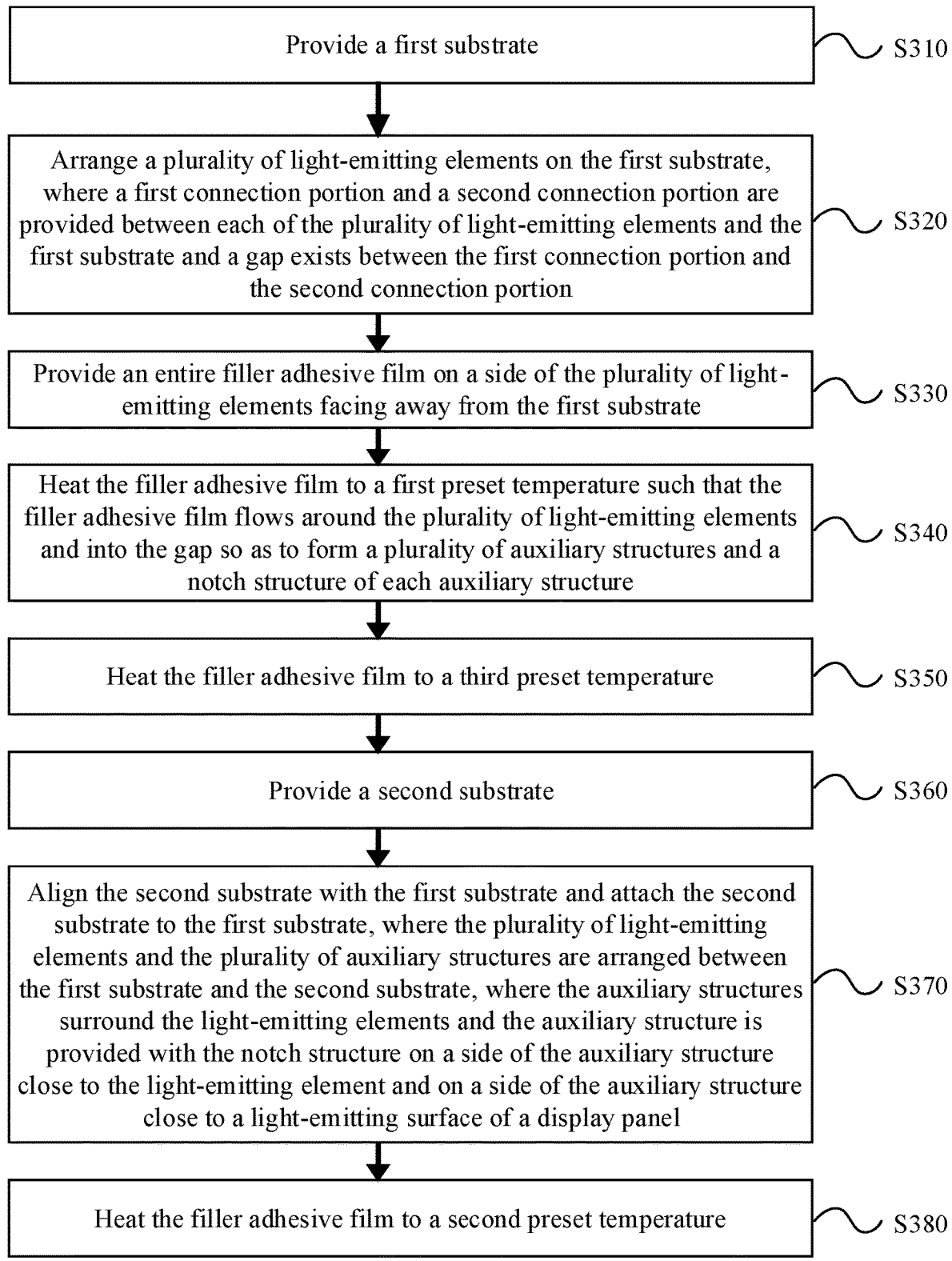
FIG. 23 is a flowchart of another preparation method of a display panel according to an embodiment of the present disclosure.

Optionally, the auxiliary structures need to be arranged between the first substrate and the second substrate. FIG. 23 is a flowchart of another preparation method of a display panel according to an embodiment of the present disclosure. As shown in FIG. 23, the preparation method includes the steps described below.

In S310, the first substrate is provided.

In S320, the plurality of light-emitting elements are arranged on the first substrate, where the first connection portion and the second connection portion are provided between the light-emitting element and the first substrate and the gap exists between the first connection portion and the second connection portion.

In S330, the entire filler adhesive film is provided on the side of the light-emitting elements facing away from the substrate.

In S340, the filler adhesive film is heated to the first preset temperature such that the filler adhesive film flows around the light-emitting elements and into the gap so as to form the auxiliary structures and the notch structure of the auxiliary structure.

In S350, the filler adhesive film is heated to a third preset temperature.

In S360, the second substrate is provided.

In S370, the second substrate is aligned with and attached to the first substrate, where the plurality of light-emitting elements and the plurality of auxiliary structures are arranged between the first substrate and the second substrate. The auxiliary structures surround the light-emitting elements and the auxiliary structure is provided with the notch structure on the side of the auxiliary structure close to the light-emitting element and on the side of the auxiliary structure close to the light-emitting surface of the display panel.

In S380, the filler adhesive film is heated to the second preset temperature.

A block wall structure includes a first surface and a second surface which are opposite to each other along a direction vertical to the first substrate, where the first surface is located on a side of the second surface close to the second substrate. Along the direction vertical to the first substrate, the auxiliary structures include a third surface and a fourth surface which are opposite to each other, where the third surface is located on a side of the fourth surface close to the first substrate. Reference may be made to FIG. 13.

A distance from the second surface to the first substrate is less than or equal to a distance from the fourth surface to the first substrate. The first preset temperature is lower than the third preset temperature and the third preset temperature is lower than the second preset temperature.

Exemplarily, the third preset temperature may be 120° C. At 120° C., the filler adhesive film will be somewhat cured, which is not exactly the same as that at 150° C. and has certain fluidity under an external force. When the filler adhesive film is heated to 150° C., the first substrate is attached to the second substrate. Under the external force, the second surface of the block wall structure between the first substrate and the second substrate can be embedded in the auxiliary structures. The second surface of the block wall structure is embedded in the auxiliary structures, which can completely shield light emitted from a top surface and the side surface of the light-emitting element and avoid mutual crosstalk between light-emitting elements in the display panel. Moreover, the light emitted from the side surface of the light-emitting element is utilized effectively by the notch structure, improving the luminescence efficiency of the display panel.

It is to be noted that the preceding are only preferred embodiments of the present disclosure and technical principles used therein. It is to be understood by those skilled in the art that the present disclosure is not limited to the embodiments described herein. Those skilled in the art can make various apparent modifications, adaptations and substitutions without departing from the scope of the present disclosure. Therefore, while the present disclosure has been described in detail via the preceding embodiments, the present disclosure is not limited to the preceding embodiments and may include more other equivalent embodiments without departing from the inventive concept of the present disclosure. The scope of the present disclosure is determined by the scope of the appended claims.

What is claimed is:

1. A display panel, comprising:
    a first substrate and a second substrate which are disposed opposite to each other;
    a plurality of light-emitting elements arranged between the first substrate and the second substrate; and
    a plurality of auxiliary structures arranged between the first substrate and the second substrate;
    wherein the plurality of auxiliary structures surround the plurality of light-emitting elements, and an auxiliary structure of the plurality of auxiliary structures is provided with a notch structure on a side of the auxiliary structure close to a respective one of the plurality of light-emitting elements and on a side of the auxiliary structure close to a light-emitting surface of the display panel;
    wherein the auxiliary structure comprises a top surface and a side wall, wherein the top surface is a surface of the plurality of auxiliary structures close to the light-emitting surface of the display panel and the side wall is in contact with a light-emitting element of the plurality of light-emitting elements; and
    wherein the auxiliary structure presents a concave surface or an inclined surface at the notch structure and the concave surface is connected between the top surface and the side wall.

2. The display panel according to claim 1, further comprising:
    a first connection portion and a second connection portion between the light-emitting element of the plurality of light-emitting elements and the first substrate;
    wherein a gap exists between the first connection portion and the second connection portion, and the auxiliary structure fills the gap.

3. The display panel according to claim 2, wherein the light-emitting element comprises a first electrode and a second electrode, and the first substrate is provided with a first electrode connection terminal and a second electrode connection terminal; and the display panel further comprises a first eutectic unit and a second eutectic unit, wherein the first eutectic unit is disposed between the first electrode and the first electrode connection terminal and the second eutectic unit is disposed between the second electrode and the second electrode connection terminal;
    wherein at least one of the first electrode, the first eutectic unit or the first electrode connection terminal constitutes the first connection portion, and at least one of the second electrode, the second eutectic unit or the second electrode connection terminal constitutes the second connection portion.

4. The display panel according to claim 1, wherein the plurality of auxiliary structures are provided as an entire surface, and the plurality of auxiliary structures provided as the entire surface comprise a plurality of openings which are disposed in a one-to-one correspondence with the plurality of light-emitting elements.

5. The display panel according to claim 1, wherein the plurality of auxiliary structures comprise a black adhesive film.

6. The display panel according to claim 1, wherein the notch structure surrounds the respective one of the plurality of light-emitting elements.

7. The display panel according to claim 1, wherein the notch structure comprises a plurality of notch units which are spaced apart from each other and surround the respective one of the plurality of light-emitting elements.

8. The display panel according to claim 7, wherein the plurality of notch units are arranged symmetrically about the respective one of the plurality of light-emitting elements.

9. The display panel according to claim 1, wherein the light-emitting element comprises a bottom surface in contact with the first substrate and a top surface facing away from the first substrate; and
    wherein a distance from the top surface of the auxiliary structure to the first substrate is less than or equal to a distance from the top surface of the light-emitting element to the first substrate.

10. The display panel according to claim 1, wherein a reflective layer is provided on both the top surface and the concave surface.

11. The display panel according to claim 1, further comprising a block wall structure between adjacent light-emitting elements, wherein an orthogonal projection of the block wall structure on a plane where the first substrate is located overlaps an orthogonal projection of the plurality of auxiliary structures on the plane where the first substrate is located.

12. The display panel according to claim 11, wherein the block wall structure is provided on the second substrate.

13. The display panel according to claim 12, wherein the block wall structure comprises a first surface and a second surface which are opposite to each other along a direction vertical to the first substrate, wherein the first surface is located on a side of the second surface close to the second substrate; and
   wherein the plurality of auxiliary structures comprise a third surface and a fourth surface which are opposite to each other along the direction vertical to the first substrate, wherein the third surface is located on a side of the fourth surface close to the first substrate;
   wherein a distance from the second surface to the first substrate is less than or equal to a distance from the fourth surface to the first substrate.

14. The display panel according to claim 1, wherein
   the light-emitting element comprises a first electrode and the first substrate is provided with a first electrode connection terminal; and the display panel further comprises a first eutectic unit between the first electrode and the first electrode connection terminal;
   at least one of the first electrode, the first eutectic unit or the first electrode connection terminal constitutes a first connection portion; and
   a distance from an end of the notch structure at the side wall to the first substrate is greater than a distance from the first connection portion to the first substrate.

15. The display panel according to claim 2, wherein a total volume of the notch structure and a size of the respective one of the plurality of light-emitting elements satisfy a relationship expressed as follows:
   $V0 \leq (L1-2W1) \times W2 \times H1$;
   wherein the first connection portion and the second connection portion have a same length, a same width and a same height; and V0 denotes the total volume of the notch structure, L1 denotes a length of the respective one of the plurality of light-emitting elements, W1 denotes a length of the first connection portion, W2 denotes a width of the first connection portion, and H1 denotes a height of the first connection portion.

16. The display panel according to claim 15, wherein the notch structure extends along a first direction, a second direction and a third direction;
   wherein the first direction is parallel to the first substrate, the second direction is vertical to the first substrate, and the third direction has a first angle with the first direction; and
   along a direction vertical to a tangent to an extension direction of the notch structure, a size of the notch structure is S0, wherein $0.5 \ \mu m \leq S0 \leq 5 \ \mu m$.

17. The display panel according to claim 1, wherein the first substrate comprises a plurality of sub-pixel regions and the plurality of light-emitting elements are in a one-to-one correspondence with the plurality of sub-pixel regions; wherein
   the plurality of sub-pixel regions comprise a first color sub-pixel region and a second color sub-pixel region;
   the first color sub-pixel region has lower luminescence efficiency than the second color sub-pixel region;
   the notch structure corresponding to the first color sub-pixel region is a first notch structure and the notch structure corresponding to the second color sub-pixel region is a second notch structure;
   an extension direction of the notch structure is parallel to the first substrate; and
   along a direction vertical to a tangent to the extension direction of the notch structure, the first notch structure has a larger size than the second notch structure.

18. The display panel according to claim 1, wherein the first substrate comprises a plurality of sub-pixel regions and the plurality of light-emitting elements are in a one-to-one correspondence with the plurality of sub-pixel regions; wherein
   the plurality of sub-pixel regions comprise a first color sub-pixel region and a second color sub-pixel region;
   the notch structure corresponding to the first color sub-pixel region is a first notch structure and the notch structure corresponding to the second color sub-pixel region is a second notch structure;
   the first color sub-pixel region has lower luminescence efficiency than the second color sub-pixel region;
   an orthogonal projection of a block wall structure corresponding to the first color sub-pixel region on a plane where the first substrate is located overlaps an orthogonal projection of the first notch structure on the plane where the first substrate is located by a first width; and
   an orthogonal projection of a block wall structure corresponding to the second color sub-pixel region on the plane where the first substrate is located overlaps an orthogonal projection of the second notch structure on the plane where the first substrate is located by a second width;
   wherein the first width is less than the second width.

\* \* \* \* \*